(12) United States Patent
Ishida et al.

(10) Patent No.: US 6,847,258 B2
(45) Date of Patent: Jan. 25, 2005

(54) POWER AMPLIFIER, POWER AMPLIFYING METHOD AND RADIO COMMUNICATION APPARATUS

(75) Inventors: Kaoru Ishida, Shijonawate (JP); Toshimitsu Matsuyoshi, Katano (JP); Masayuki Miyaji, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 44 days.

(21) Appl. No.: 10/299,363

(22) Filed: Nov. 18, 2002

(65) Prior Publication Data

US 2003/0122619 A1 Jul. 3, 2003

(30) Foreign Application Priority Data

Nov. 16, 2001 (JP) .......................................... 2001-351816

(51) Int. Cl.⁷ .............................. H03F 3/68; H03F 3/04; H03F 3/60
(52) U.S. Cl. .................... 330/124 R; 330/295; 330/302; 330/306; 330/53
(58) Field of Search ............................. 330/124 R, 302, 330/306, 295, 53

(56) References Cited

U.S. PATENT DOCUMENTS

| | | | | |
|---|---|---|---|---|
| 3,715,468 A | * | 2/1973 | Fujita ........................... | 386/22 |
| 4,200,881 A | * | 4/1980 | Carnt et al. .................... | 386/13 |
| 4,295,106 A | * | 10/1981 | Kahn ........................... | 332/156 |
| 4,994,760 A | * | 2/1991 | Roehrs ......................... | 330/295 |
| 5,640,428 A | * | 6/1997 | Abe et al. ..................... | 375/334 |
| 6,396,342 B1 | | 5/2002 | Takenaka | |

FOREIGN PATENT DOCUMENTS

JP   2001-111364   4/2001

* cited by examiner

*Primary Examiner*—Patricia Nguyen
(74) *Attorney, Agent, or Firm*—RatnerPrestia

(57) ABSTRACT

It is difficult that the impedance of the circuit part on the output side of an amplifying element at the frequency of a modulating wave is lower, and consequently, it is difficult to more effectively use the linearity of the amplifying element. The phase of a signal of the frequency of the modulating wave included in an amplified signal output from a FET is inverted by a difference frequency inverting circuit. The inverted signal of the frequency of the modulating wave and a signal of the frequency of a modulated wave included in an amplified signal output from a FET cancel each other out at the drain of the FET. At the drain end of the FET, the signal of the frequency of the modulating wave included in the amplified signal of the FET and a signal of the frequency of the modulating wave output from the FET cancel each other out.

28 Claims, 9 Drawing Sheets

POWER AMPLIFIER, POWER AMPLIFYING METHOD AND RADIO COMMUNICATION APPARATUS

BACKGROUND OF THE INVENTION

1. Field of the Invention

The present invention relates to a power amplifier, a power amplifying method amplifying high-frequency power, and a radio communication apparatus using the power amplifier.

2. Description of the Prior Art

It is required that for size reduction and power saving, power amplifiers used for portable telephone terminals and base stations have high-power and high-efficiency characteristics. In particular, when wide-band transmission signals such as W-CDMA signals are handled, it is necessary that power amplifiers have a wide band and little distortion.

However, the frequency spectrum of a modulated wave whose carrier wave is modulated by a modulating wave is normally distributed in a band of approximately the frequency of the modulating wave. When a signal of the frequency of the modulated wave having such a frequency spectrum is input to a power amplifier, because of the nonlinearity of an amplifying element such as a FET (field effect transistor) used for the power amplifier, a second-order intermodulation distortion component that appears at a frequency which is the difference between signals of different frequency components of the modulated wave is caused in addition to an intermodulation distortion component.

Moreover, as mentioned above, to provide high-power characteristics, a FET arranged in parallel in a multifinger structure or a multiplicity of FETs combined in parallel to increase the gate width is used as the amplifying element of the power amplifier.

In such power amplifiers, when the impedance at the frequency of the modulating wave of the modulated wave on the output side of the FET is high to a degree, a second-order intermodulation distortion component is caused that appears at the frequency which is the difference between signals of different frequency components of the modulated wave. The frequency of the second-order intermodulation distortion component is distributed in the neighborhood of the frequency of the modulating wave, and the second-order intermodulation distortion component is again mixed with the amplified signal at the drain electrode of the FET to make intermodulation distortion worse. This indicates that the linearity of the FET is not effectively used.

FIG. 10 shows a conventional power amplifier 1113 being excellent in distortion characteristic. The power amplifier 1113 of FIG. 10 comprises an input terminal 1101, matching circuits 1102, 1106 and 1110, a FET 1103, inductors 1104 and 1109, capacitors 1105 and 1108, a quarter-wave stripline 1107, an output terminal 1111, and a bias supply power source terminal 1112.

The matching circuit 1102 is a circuit that matches the impedance of the input terminal 1101 to that on the drain side of the FET 1103.

The inductor 1104 and the capacitor 1105 are circuits that serially resonate at the frequency of the modulated wave. It is assumed that the frequency of the modulated wave is, for example, 1 GHz and the frequency of the modulating wave of the modulated wave is, for example, 20 MHz.

The matching circuit 1106 is a circuit that matches the impedance on the output side of the FET 1103 to that on side of the matching circuit 1110.

The double wave shorting circuit 1107 is a circuit that is short-circuited for the harmonic of the frequency of the modulated wave, for example, a stripline.

The capacitor 1108, the inductor 1109 and the bias supply terminal 1112 constitute a bias choke circuit that supplies a bias voltage to the gate of the FET 1103.

The matching circuit 1110 is a circuit that matches the impedance on the side of the matching circuit 1106 to that on the side of the output terminal 1111.

Next, the operation of the conventional power amplifier will be described.

Since the signal of the frequency of the modulated wave (1 GHz) is modulated by the modulating wave (20 MHz) of the modulated wave as mentioned above, the frequency of the signal of the frequency of the modulated wave is distributed, for example, in a band of approximately ±20 MHz from the neighborhood of 1 GHz.

When input to the input terminal 1101, the signal of the frequency of the modulated wave has its impedance matched by the matching circuit 1102 and is input to the gate of the FET 1103. The drain of the FET 1103 is supplied with a bias voltage by the bias choke circuit constituted by the bias supply terminal 1112, the capacitor 1108 and the inductor 1109.

Consequently, the signal of the frequency of the modulated wave input to the gate of the FET 1103 is power-amplified by the FET 1103, and is output from the drain of the FET 1103 as an amplified signal. Because of the nonlinearity of the FET 1103, the amplified signal also includes a second-order intermodulation distortion component that appears at a frequency which is the difference between signals of different frequency components of the modulated wave. The second-order intermodulation distortion component is distributed in the neighborhood of the frequency of the modulating wave (20 MHz).

The constant of a resonance circuit constituted by the inductor 1104 and the capacitor 1105 is set so that the resonance circuit serially resonates in the neighborhood of the frequency of the modulating wave. Therefore, the impedance thereof is short-circuited at the frequency of the modulating wave (20 MHz) and is high at the frequency of the modulated wave (1 GHz).

Consequently, since the second-order intermodulation distortion component included in the amplified component is short-circuited by the resonance circuit constituted by the inductor 1104 and the capacitor 1105, the signal component that varies according to the frequency of the modulating wave is reduced in the voltage on the drain side of the FET 1103. Consequently, the above-mentioned problem is reduced that the second-order intermodulation distortion component is mixed with the amplified signal at the drain to make intermodulation distortion worse.

The amplified signal output from the FET 1103 has its second-order intermodulation distortion component smoothed by the inductor 1104 and the capacitor 1105 as mentioned above, and has its impedance matched by the matching circuit 1106. The circuit constituted by the double wave shorting circuit 1107 and the capacitor 1108 is short-circuited by the high-order harmonic (signal having frequency spectra of approximately 2 GHz and not less than 2 GHz) of the modulated wave. Therefore, the high-order harmonic of the modulated wave included in the amplified signal output from the matching circuit 1106 is short-circuited by the circuit constituted by the double wave shorting circuit 1107 and the capacitor 1108. The amplified signal having its high-order harmonic thus reduced has its impedance matched by the matching circuit 1110, and is output from the output terminal 1111.

As described above, it is necessary that power amplifiers used for a communication mode such as W-CDMA have a wide band and little distortion. To achieve this, it is extremely important that the impedance of the circuit part on the output side of the amplifying element at the frequency of the modulating wave (20 MHz) be lower than the impedance on the output side of the amplifying element at the frequency (1 GHz) of the modulated wave as mentioned above.

Moreover, if the impedance of the circuit part on the output side can be reduced in a structure other than the structure used by the conventional power amplifier 1113 described with reference to FIG. 10, the degree of freedom of design will improve accordingly.

That is, a power amplifier is required in which the impedance of the circuit part on the output side of the amplifying element at the frequency of the modulating wave can be reduced in a structure different from that of the conventional power amplifier.

Moreover, while in the conventional power amplifier 1113 described with reference to FIG. 10, the impedance at the frequency of the modulating wave (20 MHz) is made close to short-circuiting by the resonator constituted by the inductor 1104 and the capacitor 1105, in actuality, since some loss is caused at the frequency of the modulating wave at the inductor 1104 and the capacitor 1105, it is difficult to create an ideal short-circuiting at the frequency of the modulating wave. To reduce the loss, it is necessary to increase the physical sizes of the inductor 1104 and the capacitor 1105, and this increases the size of the power amplifier.

That is, it is difficult that the impedance of the circuit part on the output side of the amplifying element at the frequency of the modulating wave is lower, and consequently, it is difficult to more effectively use the linearity of the amplifying element.

In radio communication systems preceding a communication mode such as W-CDMA, since the frequency band used for communication is narrow, such a problem did not arise. However, in recent wide-band systems such as W-CDMA systems, it is an increasingly important problem.

SUMMARY OF THE INVENTION

In view of the above-mentioned problem, an object of the present invention is to provide a power amplifier, a power amplifying method capable of reducing the impedance of the circuit part on the output side of the amplifying element at the frequency of the modulating wave in a structure different from that of the conventional power amplifier, and a radio communication apparatus.

Another object of the present invention is to provide a power amplifier, a power amplifying method capable of lowering the impedance of the circuit part on the output side of the amplifying element at the frequency of the modulating wave and of more effectively using the linearity of the amplifying element, and a radio communication apparatus.

One aspect of the present invention is a power amplifier comprising:
  a splitting circuit splitting a signal of a frequency of a modulated wave into two;
  a first amplifying element having its input connected to one output of said splitting circuit;
  a second amplifying element having its input connected to the other output of said splitting circuit;
  a combining circuit combining an output of said first amplifying element with an output of said second amplifying element to output a composite signal;
  a first filter having one end connected to the output of said first amplifying element, said first filter not allowing the signal of the frequency of the modulated wave to pass therethrough and allowing a signal of a frequency band of a modulating wave of the signal of the frequency of the modulated wave to pass therethrough;
  a second filter having one end connected to the output of said second amplifying element, said second filter not allowing the signal of the frequency of the modulated wave to pass therethrough and allowing the signal of the frequency band of the modulating wave of the signal of the frequency of the modulated wave to pass therethrough; and
  an phase inverting circuit connected between the other end of said first filter and the other end of said second filter, said phase inverting circuit allowing the signal of the frequency band of the modulating wave to pass therethrough while inverting a phase of the signal of the frequency of the modulating wave.

Another aspect of the present invention is a power amplifier,
  wherein said phase inverting circuit comprises an inductor and a capacitor.

Still another aspect of the present invention is a power amplifier,
  wherein said phase inverting circuit comprises:
    an inductor having one end connected to the other end of said first filter and having its other end connected to the other end of said second filter;
    a first capacitor having one end connected to one end of said inductor and having its other end grounded; and
    a second capacitor having one end connected to the other end of said inductor and having its other end grounded, and
  wherein one end of said phase inverting circuit is one end of said inductor, and the other end of said phase inverting circuit is the other end of said inductor.

Yet still another aspect of the present invention is a power amplifier, further comprising a bias choke circuit connected at least one of said first filter, said second filter and said phase inverting circuit, said bias choke circuit supplying a bias voltage.

Still yet another aspect of the present invention is a power amplifier,
  wherein said phase inverting circuit comprises:
    a first inductor;
    a second inductor;
    a first capacitor;
    a second capacitor; and
    a third capacitor,
    wherein said first inductor has one end connected to the other end of said first filter and has its other end connected to one end of said second inductor, said second inductor has its other end connected to the other end of said second filter, said first capacitor has one end connected to the one end of said first inductor and has its other end grounded, said second capacitor has one end connected to the other end of said first inductor and has its other end grounded, and said third capacitor has one end connected to the other end of said second inductor and has its other end grounded, and
    wherein one end of said phase inverting circuit is one end of said first inductor and the other end of said phase inverting circuit is the other end of said second inductor.

A further aspect of the present invention is a power amplifier,
   wherein said phase inverting circuit comprises:
      a fourth inductor having one end connected to a bias supply and having its other end connected to the other end of said first inductor; and
      a fourth capacitor connected to one end of said fourth inductor and having its other end grounded.

A still further aspect of the present invention is a power amplifier comprising:
   a splitting circuit splitting a signal of a frequency of a modulated wave into at least two;
   a first amplifying element having its input connected to one output of said splitting circuit;
   a second amplifying element having its input connected to the other output of said splitting circuit;
   a first filter having one end connected to an output of said first amplifying element, said first filter not allowing the signal of the frequency of the modulated wave to pass therethrough and allowing a signal of a frequency band of a modulating wave of the modulated wave to pass therethrough;
   a second filter having one end connected to an output of said second amplifying element, said second filter not allowing the signal of the frequency of the modulated wave to pass therethrough and allowing the signal of the frequency band of the modulating wave to pass therethrough; and
   an inverting amplifier having its output connected to the other end of said first filter and having its input connected to the other end of the second filter, said inverting amplifier amplifying the signal of the frequency band of the modulating wave while inverting a phase of the signal of the frequency band of the modulating wave,
   wherein at least said output of said first amplifying element is output to an outside.

A yet further aspect of the present invention is a power amplifier comprising:
   a splitting circuit splitting a signal of a frequency of a modulated wave into a number N (N is an integer not less than 3);
   a number (N-1) of first amplifying elements having their inputs connected to a number (N-1) of outputs of a number N of outputs of said splitting circuit;
   a second amplifying element having its input connected to an output of said splitting circuit other than the number (N-1) of outputs of said splitting circuit;
   a first filter having one end connected to inputs of a (N-1) splitting circuit splitting its input into a number (N-1) and having their outputs connected to outputs of said number (N-1) of first amplifying elements, said first filter not allowing the signal of the frequency of the modulated wave to pass therethrough and allowing a signal of a frequency band of a modulating wave of the modulated wave to pass therethrough;
   a second filter having one end connected to an output of said amplifying element, said second filter not allowing the signal of the frequency of the modulated wave to pass therethrough and allowing the signal of the frequency band of the modulating wave to pass therethrough;
   an inverting amplifier having its input connected to the other end of said second filter and having its output connected to the other end of said first filter, said inverting amplifier amplifying the signal of the frequency band of the modulating wave while inverting a phase of the signal of the frequency band of the modulating wave; and
   a combining circuit combining at least the outputs of said number (N-1) of first amplifying elements to output a composite signal.

A still yet further aspect of the present invention is a power amplifier comprising:
   a splitting circuit splitting a signal of a frequency of a modulated wave into a number N (N is an integer not less than 3);
   a number (N-1) of first amplifying elements having their inputs connected to a number (N-1) of outputs of a number N of outputs of the splitting circuit;
   a second amplifying element having its input connected to an output of said splitting circuit other than the number (N-1) of outputs of said splitting circuit;
   a number (N-1) of first filters having one ends connected to outputs of said number (N-1) of first amplifying elements, said first filters not allowing the signal of the frequency of the modulated wave to pass therethrough and allowing a signal of a frequency band of a modulating wave of the modulated wave to pass therethrough;
   a second filter having one end connected to an output of said second amplifying element, said second filter not allowing the signal of the frequency of the modulated wave to pass therethrough and allowing the signal of the frequency band of the modulating wave to pass therethrough;
   an inverting amplifier having its input connected to the other end of said second filter, said inverting amplifier amplifying the signal of the frequency band of the modulating wave while inverting a phase of the signal of the frequency band of the modulating wave; and
   a combining circuit combining at least the outputs of said number (N-1) of first amplifying elements to output a composite signal,
   wherein said other ends of said number (N-1) of first filters are connected to the number (N-1) of outputs of a (N-1) splitting circuit splitting its input into a number (N-1) and connected to an output of said inverting amplifier.

An additional aspect of the present invention is a power amplifier comprising:
   a splitting circuit splitting a signal of a frequency of a modulated wave into a number N (N is an integer not less than 3);
   a number (N-1) of first amplifying elements having their inputs connected to a number (N-1) of outputs of a number N of outputs of said splitting circuit;
   a second amplifying element having its input connected to an output of said splitting circuit other than the number (N-1) of outputs of said splitting circuit;
   a number (N-1) of first filters having one ends connected to outputs of said number (N-1) of first amplifying elements, said first filters not allowing the signal of the frequency of the modulated wave to pass therethrough and allowing a signal of a frequency band of a modulating wave of the modulated wave to pass therethrough;
   a second filter having one end connected to an output of said second amplifying element, said second filter not allowing the signal of the frequency of the modulated wave to pass therethrough and allowing the signal of the frequency band of the modulating wave to pass therethrough;

a number (N−1) of inverting amplifiers having their outputs connected to the other ends of said number (N−1) of first filters and having their inputs connected to the number (N−1) of outputs of a (N−1) splitting circuit splitting its input into a number (N−1) and having their inputs connected to the other end of said second filter, said inverting amplifiers amplifying the signal of the frequency band of the modulating wave while inverting a phase of the signal of the frequency band of the modulating wave; and a combining circuit combining at least the outputs of said number (N−1) of first amplifying elements to output a composite signal.

A still additional aspect of the present invention is a power amplifier comprising:

a splitting circuit splitting a signal of a frequency of a modulated wave into a number N (N is an integer not less than 3);

a number (N−1) of first amplifying elements having their inputs connected to a number (N−1) of outputs of a number N of outputs of said splitting circuit;

a second amplifying element having its input connected to an output of said splitting circuit other than the number (N−1) of outputs of said splitting circuit;

a number (N−1) of first filters having one ends connected to outputs of said number (N−1) of first amplifying elements, said first filters not allowing the signal of the frequency of the modulated wave to pass therethrough and allowing a signal of a frequency band of a modulating wave of the modulated wave to pass therethrough;

a number (N−1) of inverting amplifiers having their outputs connected to the other ends of said number (N−1) of first filters, said inverting amplifiers amplifying the signal of the frequency band of the modulating wave while inverting a phase of the signal of the frequency band of the modulating wave;

a number (N−1) of second filters having one end connected to inputs of said number (N−1) of inverting amplifiers and having its other end connected to the number (N−1) of outputs of a (N−1) splitting circuits splitting its input into a number (N−1) and connected to an output of said second amplifying element, said second filters not allowing the signal of the frequency of the modulated wave to pass therethrough and allowing the signal of the frequency band of the modulating wave to pass therethrough; and a combining circuit combining at least the outputs of said number (N−1) of first amplifying elements to output a composite signal.

A yet additional aspect of the present invention is a power amplifier, wherein said output of said second amplifying element is terminated.

A still yet additional aspect of the present invention is a power amplifier, wherein that said output of said second amplifying element is terminated means that a terminating resistor is connected to the output of said second amplifying element or that a terminating load comprising a capacitor and/or an inductor is connected to the output of said second amplifying element.

A supplementary aspect of the present invention is a power amplifier, wherein said second amplifying element is smaller in amplifying element size than said first amplifying element.

A still supplementary aspect of the present invention is a power amplifier comprising a plurality of power amplifiers, wherein said splitting circuits of said power amplifiers are replaced with one common element, and the same signal of the frequency of the modulated wave is input, and wherein said combining circuits of said power amplifiers are replaced with one common element, and outputs one output signal generated by signal combination.

A yet supplementary aspect of the present invention amplifier comprising:

a plurality of power amplifiers; and a combining circuit generating by signal combination an output to be output to an outside of said power amplifiers, and outputting the output, wherein said splitting circuits of said power amplifiers are replaced with one common element, and the same signal of the frequency of the modulated wave is input.

A still yet supplementary aspect of the present invention is a power amplifier having a multilayer dielectric substrate where the power amplifier is formed.

Another aspect of the present invention is a power amplifier, wherein said multilayer dielectric substrate comprises: a semiconductor substrate disposed thereabove; and a multilayer dielectric substrate disposed below said semiconductor substrate.

Still another aspect of the present invention is a power amplifier, comprising an internal matching substrate in which said multilayer dielectric substrate is disposed.

Yet still another aspect of the present invention is a power amplifier, wherein a frequency of the signal of the frequency of the modulated wave is not more than a thousand times a frequency band of the signal of the frequency band of the modulating wave.

Still yet another aspect of the present invention is a power amplifier, wherein said first filter and said second filter allow a harmonic component of the signal of the frequency of the modulating wave to pass therethrough.

A further aspect of the present invention is a radio communication apparatus having at least a transmitting circuit outputting a transmission wave, wherein said power amplifier is used for said transmitting circuit.

A still further aspect of the present invention is a power amplifying method comprising the steps of:

a splitting step splitting a signal of a frequency of a modulated wave into two;

a first amplifying step having its input connected to one output of said splitting step and amplifying its input;

a second amplifying step having its input connected to the other output of said splitting step and amplifying its input;

a combining step combining an output of said first amplifying step with an output of said second amplifying step to output a composite signal;

a first filtering step having one end connected to the output of said first amplifying step, said first filtering step not allowing the signal of the frequency of the modulated wave to pass therethrough and allowing a signal of a frequency band of a modulating wave of the signal of the frequency of the modulated wave to pass therethrough;

a second filtering step having one end connected to the output of said second amplifying step, said second filtering step not allowing the signal of the frequency of the modulated wave to pass therethrough and allowing the signal of the frequency band of the modulating wave of the signal of the frequency of the modulated wave to pass therethrough; and an phase inverting step connected between the other end of said first filtering step and the other end of said second filtering step, said phase inverting step allowing the signal of the frequency band of the modulating wave to pass therethrough while inverting a phase of the signal of the frequency of the modulating wave.

A yet further aspect of the present invention is a power amplifying method comprising the steps of:

a splitting step splitting a signal of a frequency of a modulated wave into at least two;

a first amplifying step having its input connected to one output of said splitting step and amplifying its input;

a second amplifying step having its input connected to the other output of said splitting step and amplifying its input;

a first filtering step having one end connected to an output of said first amplifying step, said first filtering step not allowing the signal of the frequency of the modulated wave to pass therethrough and allowing a signal of a frequency band of a modulating wave of the modulated wave to pass therethrough;

a second filtering step having one end connected to an output of said second amplifying step, said second filtering step not allowing the signal of the frequency of the modulated wave to pass therethrough and allowing the signal of the frequency band of the modulating wave to pass therethrough; and an inverting amplifying step having its output connected to the other end of said first filtering step and having its input connected to the other end of the second filtering step, said inverting amplifying step amplifying the signal of the frequency band of the modulating wave while inverting a phase of the signal of the frequency band of the modulating wave, wherein at least said output of said first amplifying step is output to an outside.

A still yet further aspect of the present invention is a power amplifying method comprising the steps of:

a splitting step splitting a signal of a frequency of a modulated wave into a number N (N is an integer not less than 3);

a number (N-1) of first amplifying steps having their inputs connected to a number (N-1) of outputs of a number N of outputs of said splitting step and amplifying their inputs;

a second amplifying step having its input connected to an output of said splitting step other than the number (N-1) of outputs of said splitting step and amplifying its input;

a first filtering step having one end connected to inputs of a (N-1) splitting step splitting its input into a number (N-1) and having their outputs connected to outputs of said number (N-1) of first amplifying steps, said first filter not allowing the signal of the frequency of the modulated wave to pass therethrough and allowing a signal of a frequency band of a modulating wave of the modulated wave to pass therethrough;

a second filtering step having one end connected to an output of said amplifying step, said second filtering step not allowing the signal of the frequency of the modulated wave to pass therethrough and allowing the signal of the frequency band of the modulating wave to pass therethrough;

an inverting amplifying step having its input connected to the other end of said second filtering step and having its output connected to the other end of said first filtering step, said inverting amplifying step amplifying the signal of the frequency band of the modulating wave while inverting a phase of the signal of the frequency band of the modulating wave; and a combining step combining at least the outputs of said number (N-1) of first amplifying steps to output a composite signal.

An additional aspect of the present invention is a power amplifying method comprising the steps of:

a splitting step splitting a signal of a frequency of a modulated wave into a number N (N is an integer not less than 3);

a number (N-1) of first amplifying steps having their inputs connected to a number (N-1) of outputs of a number N of outputs of the splitting circuit and amplifying their inputs;

a second amplifying step having its input connected to an output of said splitting step other than the number (N-1) of outputs of said splitting step and amplifying its input;

a number (N-1) of first filtering steps having one ends connected to outputs of said number (N-1) of first amplifying steps, said first filtering steps not allowing the signal of the frequency of the modulated wave to pass therethrough and allowing a signal of a frequency band of a modulating wave of the modulated wave to pass therethrough;

a second filtering step having one end connected to an output of said second amplifying step, said second filtering step not allowing the signal of the frequency of the modulated wave to pass therethrough and allowing the signal of the frequency band of the modulating wave to pass therethrough;

an inverting amplifying step having its input connected to the other end of said second filtering step, said inverting amplifying step amplifying the signal of the frequency band of the modulating wave while inverting a phase of the signal of the frequency band of the modulating wave; and a combining step combining at least the outputs of said number (N-1) of first amplifying steps to output a composite signal, wherein said other ends of said number (N-1) of first filtering step are connected to the number (N-1) of outputs of a (N-1) splitting step splitting its input into a number (N-1) and connected to an output of said inverting amplifying step.

A still additional aspect of the present invention is a power amplifying method comprising the steps of:

a splitting step splitting a signal of a frequency of a modulated wave into a number N (N is an integer not less than 3);

a number (N−1) of first amplifying steps having their inputs connected to a number (N−1) of outputs of a number N of outputs of said splitting circuit and amplifying their inputs;

a second amplifying step having its input connected to an output of said splitting circuit other than the number (N−1) of outputs of said splitting circuit and amplifying its input;

a number (N−1) of first filtering steps having one ends connected to outputs of said number (N−1) of first amplifying steps, said first filtering steps not allowing the signal of the frequency of the modulated wave to pass therethrough and allowing a signal of a frequency band of a modulating wave of the modulated wave to pass therethrough;

a second filtering step having one end connected to an output of said second amplifying step, said second filtering step not allowing the signal of the frequency of the modulated wave to pass therethrough and allowing the signal of the frequency band of the modulating wave to pass therethrough;

a number (N−1) of inverting amplifying steps having their outputs connected to the other ends of said number (N−1) of first filtering steps and having their inputs connected to the number (N−1) of outputs of a (N−1) splitting step splitting its input into a number (N−1) and having their inputs connected to the other end of said second filter, said inverting amplifying step amplifying the signal of the frequency band of the modulating wave while inverting a phase of the signal of the frequency band of the modulating wave; and a combining step combining at least the outputs of said number (N−1) of first amplifying steps to output a composite signal.

A yet additional aspect of the present invention is a power amplifying step comprising the steps of:

a splitting step splitting a signal of a frequency of a modulated wave into a number N (N is an integer not less than 3);

a number (N−1) of first amplifying steps having their inputs connected to a number (N−1) of outputs of a number N of outputs of said splitting step and amplifying their inputs;

a second amplifying step having its input connected to an output of said splitting step other than the number (N−1) of outputs of said splitting step and amplifying its input;

a number (N−1) of first filtering steps having one ends connected to outputs of said number (N−1) of first amplifying steps, said first filtering steps not allowing the signal of the frequency of the modulated wave to pass therethrough and allowing a signal of a frequency band of a modulating wave of the modulated wave to pass therethrough;

a number (N−1) of inverting amplifying steps having their outputs connected to the other ends of said number (N−1) of first filtering steps, said inverting amplifying steps amplifying the signal of the frequency band of the modulating wave while inverting a phase of the signal of the frequency band of the modulating wave;

a number (N−1) of second filtering steps having one end connected to inputs of said number (N−1) of inverting amplifying step and having its other end connected to the number (N−1) of outputs of a (N−1) splitting step splitting its input into a number (N−1) and connected to an output of said second amplifying element, said second filtering steps not allowing the signal of the frequency of the modulated wave to pass therethrough and allowing the signal of the frequency band of the modulating wave to pass therethrough; and a combining step combining at least the outputs of said number (N−1) of first amplifying steps to output a composite signal.

EXPLANATION OF REFERENCE NUMERALS

Figure 1:
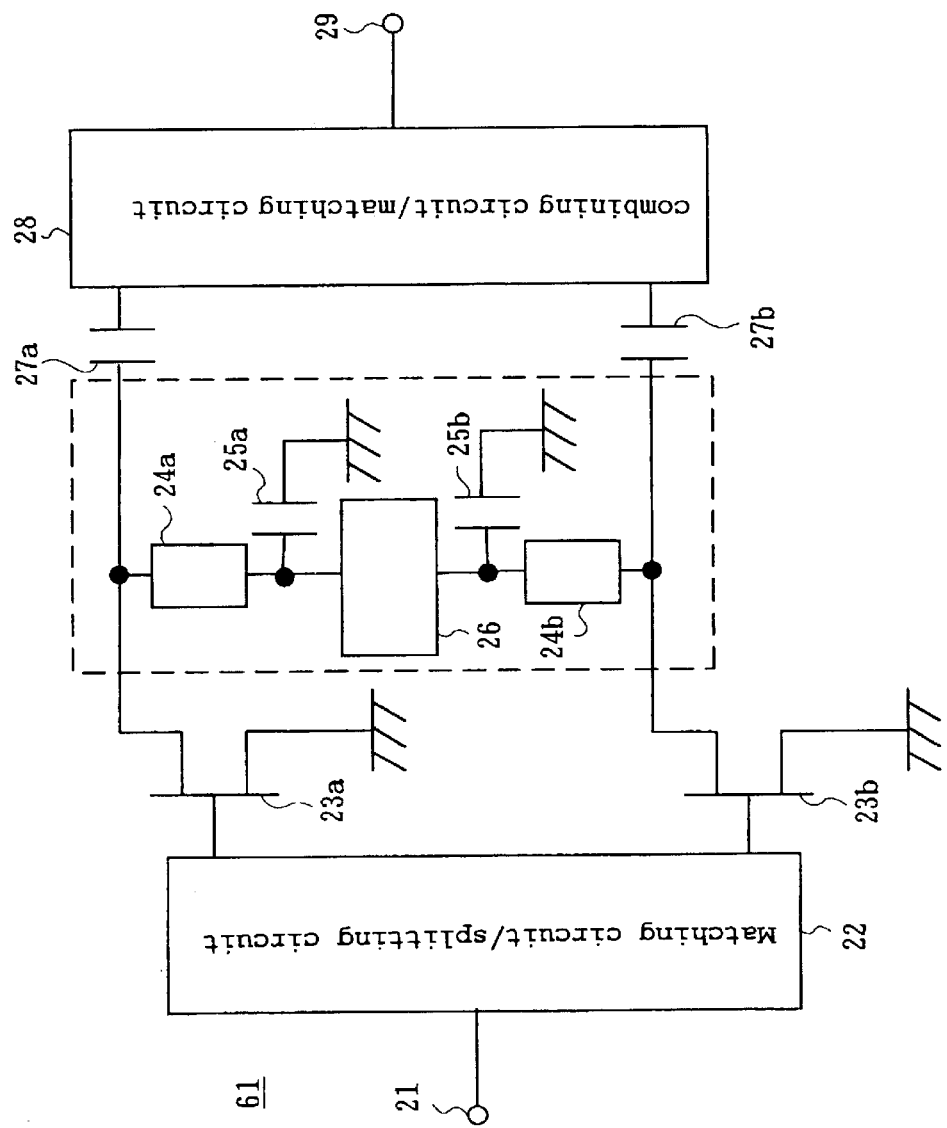
FIG. 1 is a view showing the structure of a power amplifier according to a first embodiment of the present invention.

1 Oscillator
2 Oscillator
3 Modulator
4 Mixer
5 Power amplifier
6 Duplexer
7 Antenna
21 Input terminal
22 Matching circuit/splitting circuit
23a FET
23b FET
24a Double wave shorting/bias choke circuit
24b Double wave shorting/bias choke circuit
25a Capacitor
25b Capacitor
26 Difference frequency phase inverting circuit
27a Capacitor
27b Capacitor
28 Combining circuit/matching circuit 29 Output terminal
41 Matching circuit/splitting circuit
42a FET
42b FET
42c FET
45a Inverting amplifier
42b Inverting amplifier

DESCRIPTION OF THE PREFERRED EMBODIMENTS

Hereinafter, embodiments of the present invention will be described.

First Embodiment

FIG. 1 shows the structure of a power amplifier 61 according to a first embodiment of the present invention.

Figure 9:
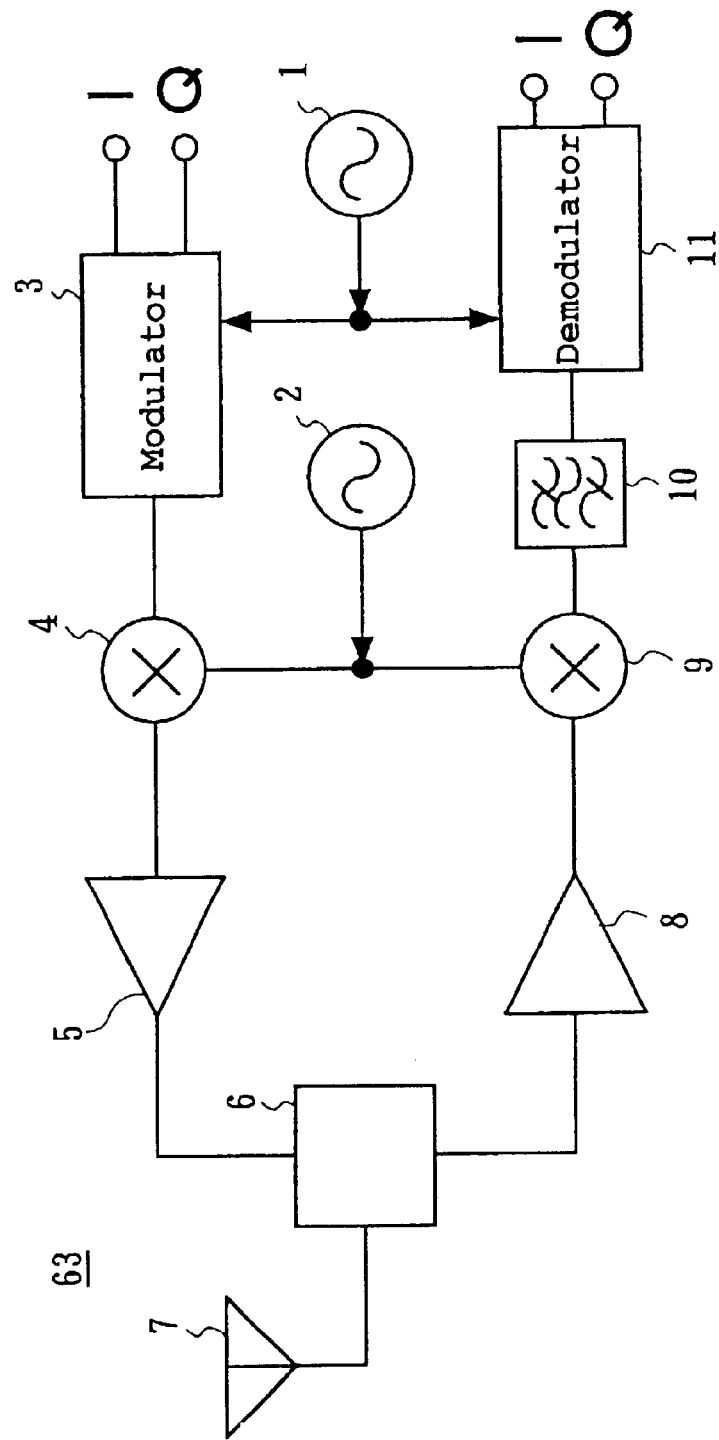
FIG. 9 is a view showing the structure of a radio circuit in the first and the second embodiments of the present invention.
Figure 10:
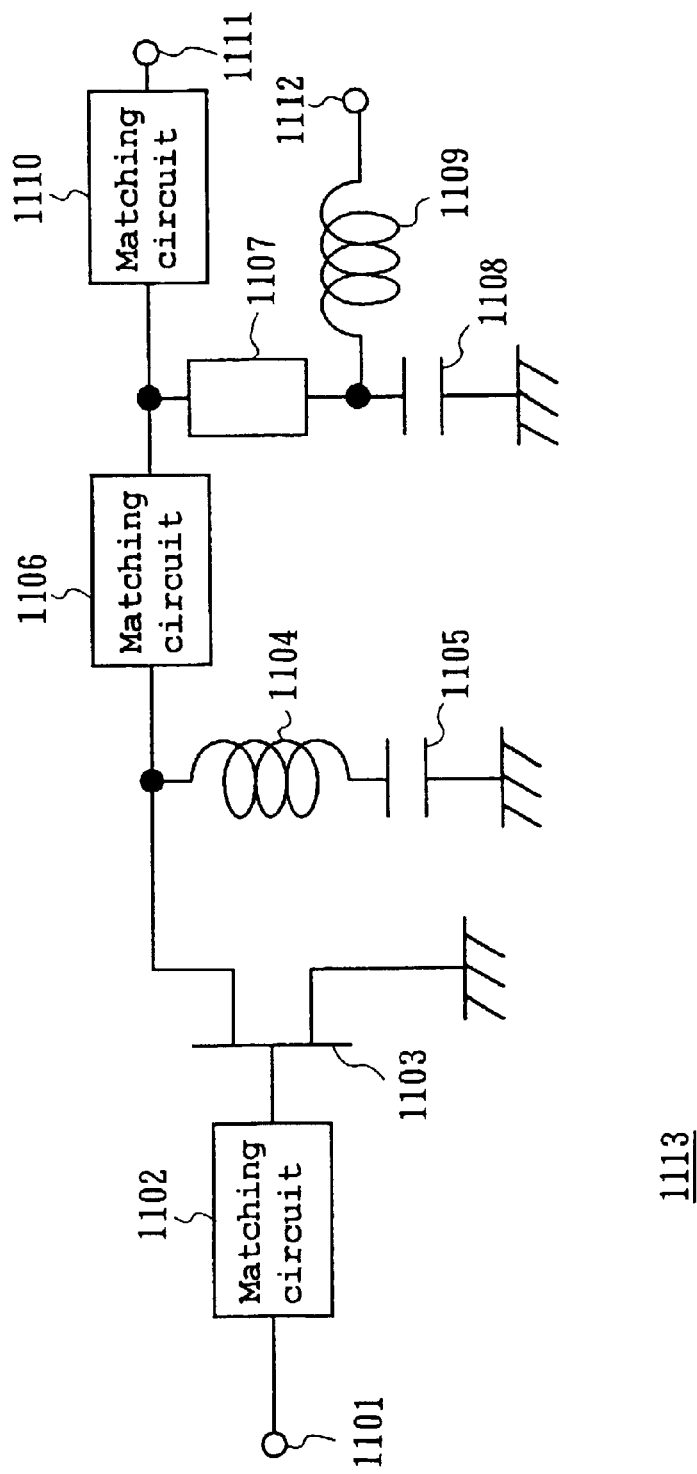
FIG. 10 is a view showing the structure of the conventional power amplifier being excellent in distortion characteristic.

The power amplifier 61 of FIG. 1 is used, for example, as a power amplifier 5 of a radio circuit 63 shown in FIG. 9.

First, the radio circuit 63 of FIG. 9 will be briefly described.

The radio circuit 63 comprises oscillators 1 and 2, a modulator 3, mixers 4 and 9, the power amplifier 5, a low-noise amplifier 8, a duplexer 6 and an antenna 7.

The modulator 3 is a quadrature modulator that modulates the signal output from the oscillator 1 with a baseband I signal and a baseband Q signal generated by a non-illustrated baseband portion. In the description given below, the frequency of the baseband I signal and the baseband Q signal will be called the frequency of the modulating wave, and it is assumed that the frequency of the modulating wave is, for example, 20 MHz.

The mixer 4 is a circuit that mixes the signal modulated by the modulator 3 with the signal output from the oscillator 2 into a signal of a transmission frequency.

In the description given below, the transmission frequency will be called the frequency of the modulated wave, and it is assumed that the frequency of the modulated wave is, for example, 1 GHz. Moreover, as in the prior art, the frequency of the signal of the frequency of the modulated wave is distributed in a band of approximately ±20 MHz, which is the modulating frequency, from the neighborhood of 1 GHz.

The power amplifier 5 is a circuit that amplifies the power of the signal of the transmission frequency, that is, the signal of the frequency of the modulated wave, and outputs the amplified signal to the duplexer 6.

The duplexer 6 is a circuit that directs the amplified signal to the antenna 7 and directs the reception signal received by the antenna 7 to the low-noise amplifier 8.

The low-noise amplifier 8 is a circuit that amplifies the reception signal output from the duplexer 6.

The mixer 9 is a circuit that mixes the signal output from the low-noise amplifier 8 with the signal output from the oscillator 2 into a signal of an intermediate frequency.

A filter 10 is a circuit that reduces the unnecessary frequency component of the signal of the intermediate frequency.

A demodulator 11 is a quadrature demodulator that combines the signal of the intermediate frequency with the signal output from the oscillator 1 to thereby restore the baseband I signal and the baseband Q signal.

The radio circuit 63 as described above is used for portable telephone terminals using a communication mode such as W-CDMA and as the radio circuits of base stations of the portable telephone terminals. By using the power amplifier 61 of FIG. 1 as the power amplifier 5 of the radio circuit 63, a radio circuit 63 can be realized that is excellent in distortion characteristic over a wide band and consumes only a small amount of power. The power amplifier 61 of FIG. 1 used as the power amplifier 5 of the radio circuit 63 will be described.

In FIG. 1, to the input terminal 21 of the power amplifier 61, the input of a matching circuit/splitting circuit 22 is connected, and to the two outputs of the matching circuit/splitting circuit 22, the gate of a FET 23a and the gate of a FET 23b are connected. The drain of the FET 23a is connected to one input of a combining circuit/matching circuit 28 through a capacitor 27a for interrupting direct current, and the drain of the FET 23b is connected to the other input of the combining circuit/matching circuit 28 through a capacitor 27b for interrupting direct current. The output of the combining circuit/matching circuit 28 is connected to an output terminal 29.

The sources of the FET 23a and the FET 23b are both grounded. To the drain of the FET 23a, one end of a double wave shorting/bias choke circuit 24a is connected. Likewise, to the drain of the FET 24a, one end of a double wave shorting/bias choke circuit 24b is connected.

Between the other end of the double wave shorting/bias choke circuit 24a and the other end of the double wave shorting/bias choke circuit 24b, a difference frequency phase inverting circuit 26 is connected. To one end of the difference frequency phase inverting circuit 26, one end of a capacitor 25a for bypassing a double wave is connected, and the other end of the capacitor 25a is grounded. Likewise, to the other end of the difference frequency phase inverting circuit 26, one end of a capacitor 25b for bypassing a double wave is connected, and the other end of the capacitor 25b is grounded.

The input terminal 21 is a terminal to which the signal of the frequency of the modulated wave, which is the input signal, is input. The output terminal 29 is a terminal from which the amplified signal, which is the output signal, is output.

The matching circuit/splitting circuit 22 is a circuit that matches the impedance on the input terminal side with each of the impedances on the gate sides of the FETs 23a and 24b, and splits into two the signal of the frequency of the modulated wave input from the input terminal 21 and inputs the split signals to the gates of the FETs 23a and 23b.

The FET 23a and the FET 23b are amplifying elements that amplify the power of the signal of the frequency of the modulated wave input to the gates thereof.

The double wave shorting/bias choke circuit 24a is a circuit having a function of a filter that does not allow the signal of the frequency of the modulated wave (signal of a frequency of approximately 1 GHz) to pass therethrough and allows the signal of the frequency of the modulating wave (signal of a frequency of approximately 20 MHz) to pass therethrough, a function of short-circuiting the impedance at the frequency of the high-order harmonic of the frequency of the modulated wave, and a function of a bias choke circuit that supplies a bias voltage to the drain of the FET 23a.

Likewise, the double wave shorting/bias choke circuit 24b is a circuit having a function of a filter that does not allow the signal of the frequency of the modulated wave (signal of a frequency of approximately 1 GHz) to pass therethrough and allows the signal of the frequency of the modulating wave (signal of a frequency of approximately 20 MHz) to pass therethrough, a function of short-circuiting the impedance at the frequency of the high-order harmonic of the frequency of the modulated wave, and a function of a bias choke circuit that supplies a bias voltage to the drain of the FET 23a.

The difference frequency phase inverting circuit 26 is a circuit that, when the signal of the frequency of the modulating wave passes therethrough, inverts the phase of the signal of the frequency of the modulating wave.

The combining circuit/matching circuit 28 is a circuit that matches each of the impedances on the sides of the capacitors 27a and 27b with the impedance on the side of the output terminal 29, and combines the amplified signal having passed through the capacitor 27a with the amplified signal having passed through the capacitor 27b and outputs the composite signal to the output terminal 29.

Figure 2:
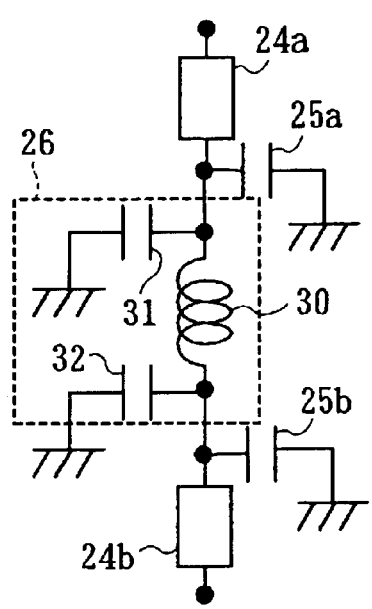
FIG. 2 is a view showing a detailed structure of the part of a difference frequency phase inverting circuit and double wave shorting/bias choke circuits of the power amplifier according to the first embodiment of the present invention.

FIG. 2 shows a detailed structure of the part of the double wave shorting/bias choke circuit 24a, the double wave shorting/bias choke circuit 24b and the difference frequency phase inverting circuit 26.

That is, the difference frequency phase inverting circuit 26 comprises capacitors 31 and 32 and an inductor 30. One end of the inductor 30 is connected to the other end of the double wave shorting/bias choke circuit 24a, and the other end of the inductor 30 is connected to the other end of the double wave shorting/bias choke circuit 24b. To one end of the inductor 30, one end of the capacitor 31 is connected, and the other end of the capacitor 31 is grounded. To the other end of the inductor 30, one end of the capacitor 32 is connected, and the other end of the capacitor 32 is grounded. The capacitances of the capacitors 31 and 32 and the inductance of the inductor 30 are adjusted so that the phase of the signal of the frequency of the modulating wave (20 MHz) having passed through the difference frequency phase inverting circuit 26 is inverted 180 degrees.

The double wave shorting/bias choke circuits 24a and 24b each have a structure such that the output end of a non-illustrated bias supply terminal is connected to a stripline having a length ¼ the wavelength of the frequency of the modulated wave and the input end of the bias supply terminal is connected to a bias supply terminal supplying a direct current bias.

Next, the operation of the present embodiment structured as described above will be described.

Assume now that the signal of the frequency of the modulated wave is input to the input terminal 21. As mentioned above, this signal is a signal of a frequency of 1 GHz where the frequency is distributed in a band of approximately the frequency of the modulating wave (20 MHz).

The signal of the frequency of the modulated wave input to the input terminal 21 is split into two by the matching circuit/splitting circuit 22, and the two split signals of the frequency of the modulated wave are input to the gate of the FET 23a and the gate of the FET 24b. At this time, the matching circuit/splitting circuit 22 matches the impedance on the side of the input terminal 21 to each of the impedances on the gate sides of the FET 23a and the FET 23b.

To the drain of the FET 23a, a direct current bias is supplied from the double wave shorting/bias choke circuit 24a. The signal of the frequency of the modulated wave output to the gate of the FET 23a is amplified by the FET 23a and output to the drain of the FET 23a.

Likewise, to the drain of the FET 23b, a direct current bias is supplied from the double wave shorting/bias choke circuit 24b. The signal of the frequency of the modulated wave output to the gate of the FET 23b is amplified by the FET 23b and output to the drain of the FET 23b.

While the FET 23a and the FET 23b have a linear characteristic, a nonlinear characteristic is conspicuous during high-efficiency operation. Because of the nonlinear characteristic, the amplified signal which is the signal of the frequency of the modulated wave amplified by the FET 23a includes a distortion component. Examples of this distortion component include a distortion component of the high-order harmonic of the signal of the frequency of the modulated wave (distortion component of a frequency of not less than approximately 2 GHz), a third-order intermodulation distortion component that appears at a frequency in the neighborhood of the frequency of the modulated wave (distortion component that appears in the neighborhood of 1 GHz) and a second-order intermodulation distortion component having a frequency which is the difference between different frequency components of the signal of the frequency of the modulated wave to be amplified (distortion component of a frequency of approximately 20 MHz).

The double wave shorting/bias choke circuit 24a allows the second-order intermodulation distortion component, that is, the signal of the frequency of the modulating wave to pass therethrough, and short-circuits the signal of the frequency of the high-order harmonic so as to be totally reflected. Moreover, since the impedance is high at the frequency of the modulated wave, the double wave shorting/bias choke circuit 24a does not allow the signal of the frequency of the modulated wave to pass therethrough. Therefore, when the amplified signal including such a distortion component as well is output from the drain of the FET 23a, of the amplifier signal, the second-order intermodulation distortion component is input to one end of the double wave shorting/bias choke circuit 24a, and the signal of the frequency of the modulating wave passes through the double wave shorting/bias choke circuit 24a. On the other hand, the signal of the frequency of the modulating wave is input to the difference frequency phase inverting circuit 26.

Of the amplified signal, the signal of the frequency of the modulated wave does not pass through the double wave shorting/bias choke circuit 24a and is output to one input of the combining circuit/matching circuit 28 through the capacitor 27a.

The signal of the frequency of the modulating wave having passed through the double wave shorting/bias choke circuit 24a has its phase inverted 180 degrees by passing through the difference frequency phase inverting circuit 26. That is, the capacitances of the capacitors 31 and 32 and the inductance of the inductor 30 of the difference frequency phase inverting circuit 26 are previously adjusted so that the phase of the frequency of the modulating wave having passed through the difference frequency phase inverting circuit 26 is inverted 180 degrees. The signal of the frequency of the modulating wave having passed through the difference frequency phase inverting circuit 26 further passes through the double wave shorting/bias choke circuit 24b to reach the drain end of the FET 23b. The phase of this signal of the frequency of the modulating wave and the phase of the signal of the frequency of the modulating wave which is the second-order intermodulation distortion component included in the amplified component amplified by the FET 23b and output to the drain end of the FET 23b are different from each other by 180 degrees. Therefore, these two signals of the frequency of the modulating wave cancel each other out at the drain end of the FET 23b. Consequently, at the drain of the FET 23b, since the signals of the frequency of the modulating wave cancel each other out, intermodulation distortion can be prevented from deteriorating due to the mixture of the signal of the frequency of the modulating wave which is the second-order intermodulation distortion component with the signal of the frequency of the modulated wave at the drain of the FET 23b.

Likewise, the amplified signal at the FET 23b has its phase inverted by 180 degrees by the double wave phase inverting circuit 26, and reaches the drain end of the FET 23a. Since the phase of this signal of the frequency of the modulating wave is different by 180 degrees from the phase of the signal of the modulating frequency which is the second-order intermodulation distortion component included in the amplified signal output from the drain end of the FET 23a, these two signals of the frequency of the modulating wave cancel each other out at the drain of the FET 23a. Consequently, at the FET 23a, as in the FET 23b, intermodulation distortion can be prevented from deteriorating due to the mixture of the signal of the frequency of the modulating wave with the signal of the frequency of the modulated wave at the drain.

Moreover, of the amplified signal output from the FET 23b, the signal of the frequency of the modulated wave does not pass through the double wave shorting/bias choke circuit 24b and is output to the other input of the combining circuit/matching circuit 28 through the capacitor 27b.

The combining circuit/matching circuit 28 combines the signals of the modulating wave input to the two inputs with each other, and outputs the composite signal to the output terminal 29. At this time, the combining circuit/matching circuit 28 matches each of the impedances on the sides of the capacitors 27a and 27b to the impedance on the side of the output terminal 29.

The signal of the modulated wave thus amplified is output from the output terminal 29.

Figure 3:
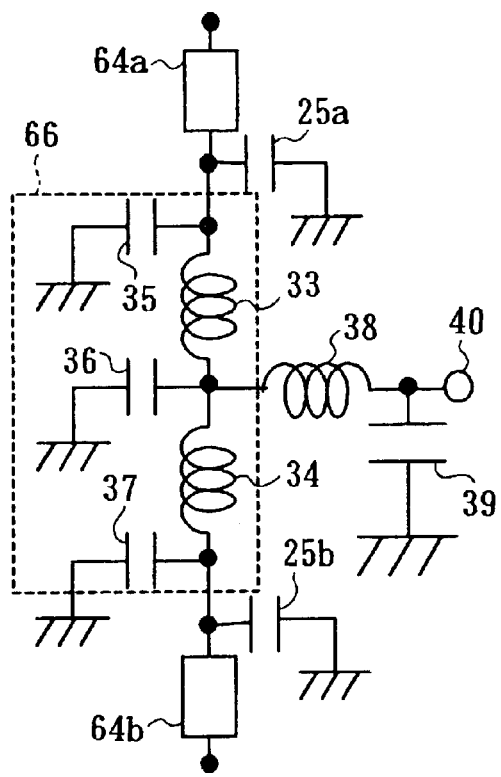
FIG. 3 is a view showing a detailed structure of the part of the difference frequency phase inverting circuit and the double wave shorting/bias choke circuits of the power amplifier according to the first embodiment of the present invention.

While in the present invention, the difference frequency phase inverting circuit 26 and the double wave shorting/bias choke circuits 24a and 24b are structured as shown in FIG. 2, the structure is not limited thereto and may be as shown in FIG. 3.

FIG. 3 shows a structure in which double wave shorting circuits 64a and 64b are used instead of the double wave shorting/bias choke circuits 24a and 24b, a difference frequency phase inverting circuit 66 is used instead of the difference wave phase inverting circuit 26, and a bias choke circuit is connected to the difference frequency phase inverting circuit 66.

In FIG. 3, the double wave shorting circuits 64a and 64b are each a stripline having a length ¼ the wavelength at the frequency of the modulated wave. The difference frequency phase inverting circuit 66 comprises inductors 33 and 34 and capacitors 35, 36 and 37. One end of the inductor 33 is connected to the other end of the double wave shorting circuit 64a, the other end of the inductor 33 is connected to one end of the inductor 34, and the other end of the inductor 34 is connected to the other end of the double shorting circuit 64b. To one end of the inductor 33, one end of the capacitor 35 is connected, and the other end of the capacitor 35 is grounded. To the other end of the inductor 33, one end of the capacitor 36 is connected, and the other end of the capacitor 36 is grounded. To the other end of the inductor 34, one end of the capacitor 37 is connected, and the other end of the capacitor 37 is grounded.

The inductances of the inductors 33 and 34 and the capacitances of the capacitors 35, 36 and 37 are previously adjusted so that, as in the case of the difference frequency phase inverting circuit 26, when the signal of the frequency of the modulating wave passes through the difference frequency phase inverting circuit 66, the phase of the signal is inverted 180 degrees.

The bias choke circuit has a structure such that one end of the inductor 38 and one end of the capacitor 39 are connected to a bias supply terminal 40, the other end of the capacitor 39 is grounded and the other end of the inductor 38 is connected to the other end of the inductor 33.

When the circuit shown in FIG. 3 is used instead of the circuit shown in FIG. 2, a direct current bias can be supplied to the FET 23a and the FET 23b and the phase of the signal of the frequency of the modulating wave passing through the difference frequency phase inverting circuit 66 can also be inverted 180 degrees. Consequently, equal effects to those obtained when the circuit of FIG. 2 is used are obtained.

As described above, in the power amplifier 61 of the present invention, since the signals of the frequency of the modulating wave cancel each other out at the drain end of each of the FET 23a and the FET 23b, intermodulation distortion can be prevented from deteriorating due to the mixture of the signal of the frequency of the modulating wave with the signal of the frequency of the modulated wave at the drains.

Figure 5:
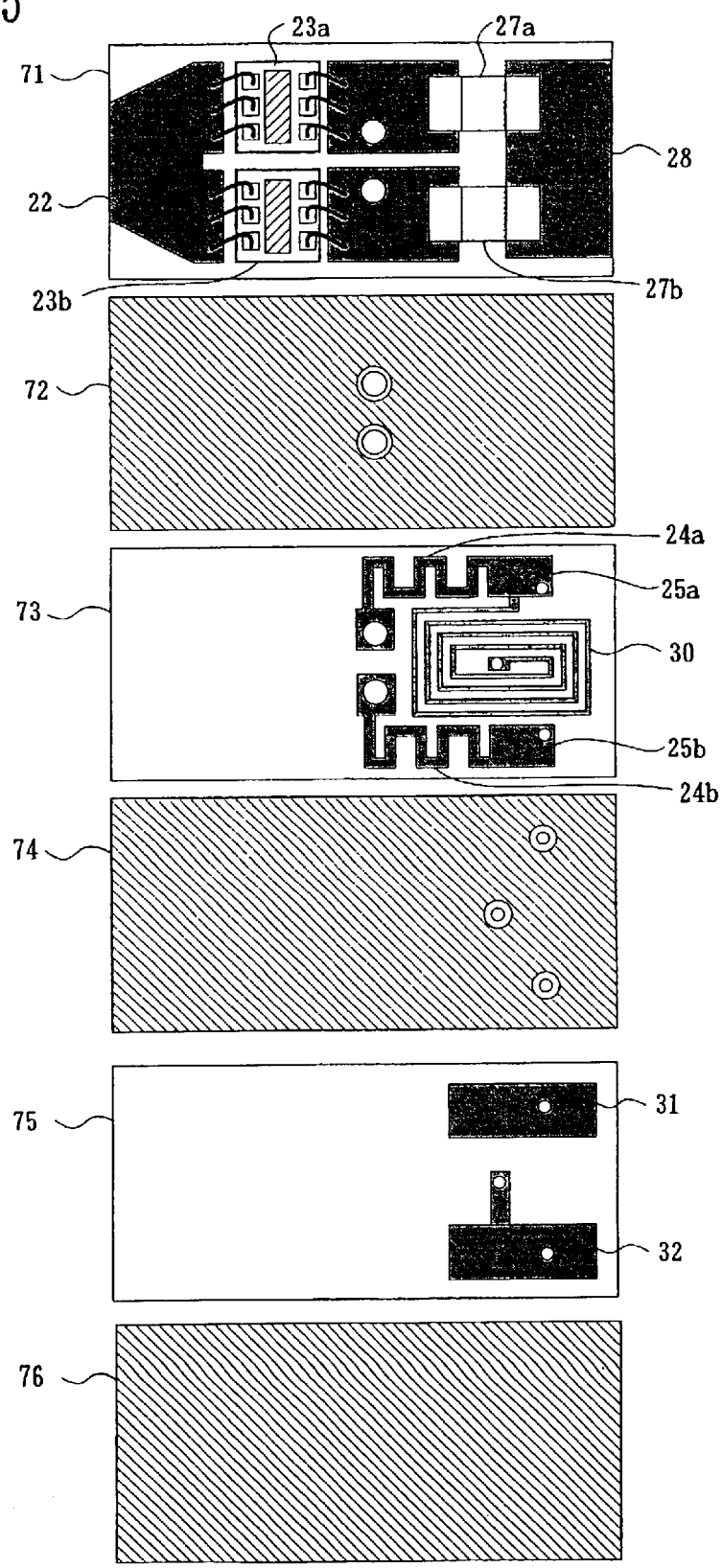
FIG. 5 is a view showing an example in which the power amplifier according to the first embodiment of the present invention is formed within a multilayer dielectric substrate.

FIG. 5 shows an example in which the power amplifier 61 of the present embodiment is formed within a dielectric lamination comprising a lamination of dielectric substrates 71 to 76.

On the dielectric substrate 71, the following are formed: the matching circuit/splitting circuit 22; the FETs 23a and 23b; the capacitors 27a and 27b formed as chip capacitors; and the combining circuit/matching circuit 28.

On the dielectric substrate 72 disposed below the dielectric substrate 71, a shield electrode is formed. On the dielectric substrate 73 disposed below the dielectric substrate 72, the double wave shorting/bias choke circuits 24a and 24b and the inductor 30 are formed. Between the dielectric substrate 73 and grounded layers which are the shield electrode of the dielectric substrate 72 and a shield electrode of the dielectric substrate 74, the bypass capacitors 25a and 25b are formed.

On the dielectric substrate 74 disposed below the dielectric substrate 73, the shield electrode is formed. On the dielectric substrate 75 disposed below the dielectric substrate 73, the capacitors 31 and 32 are formed. On the dielectric substrate 76 disposed below the dielectric substrate 75, a shield electrode is formed.

Figure 6:
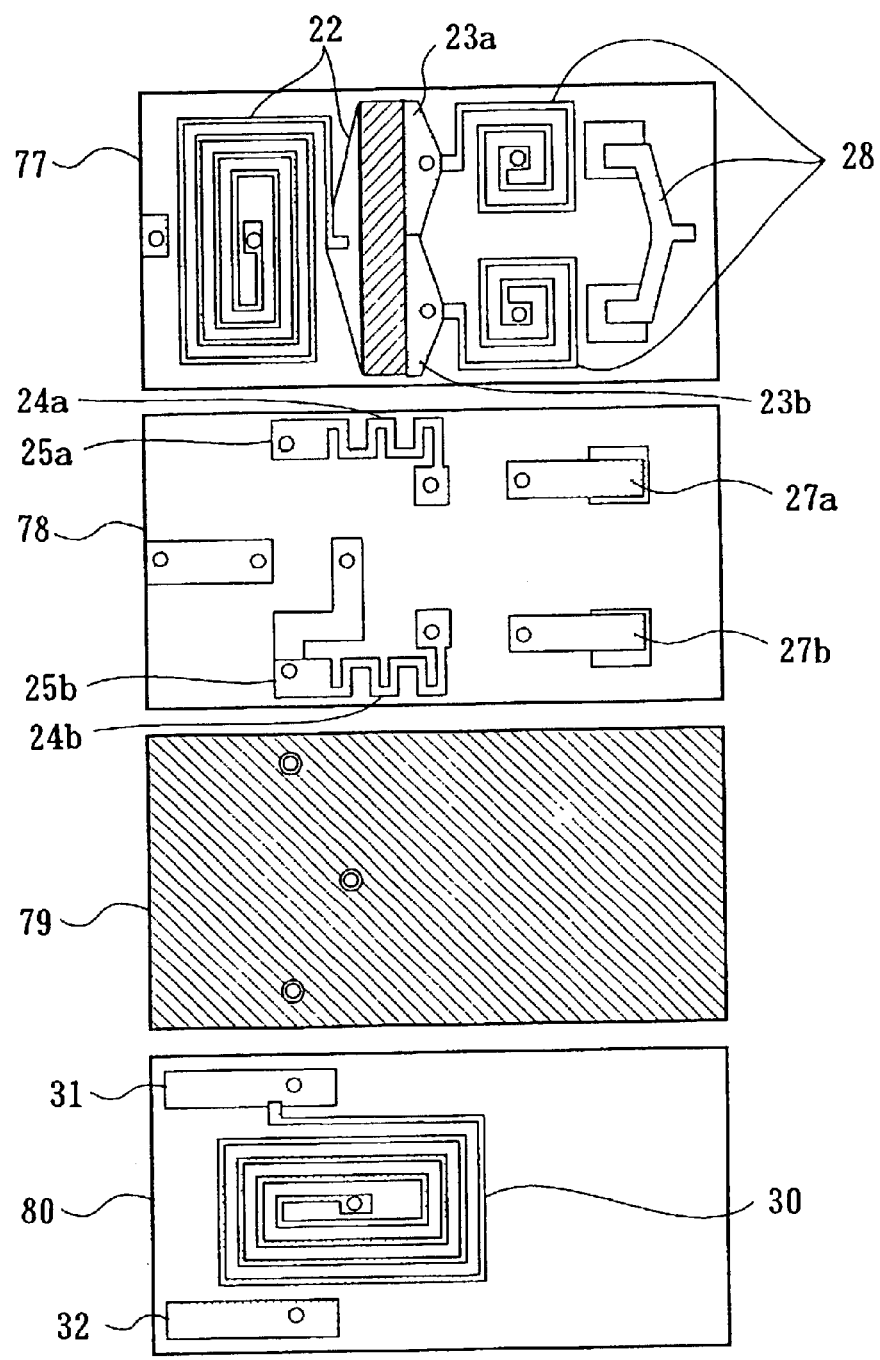
FIG. 6 is a view showing an example in which the power amplifier according to the first embodiment of the present invention is formed on dielectric layers disposed on a semiconductor substrate.

FIG. 6 shows an example in which the power amplifier 61 of the present embodiment is formed on dielectric layers on a semiconductor substrate.

On the semiconductor substrate 77, an insulating film such as a polyimide film is formed. On the semiconductor substrate 77, the following are formed: the matching circuit/splitting circuit 22; the FETs 23a and 23b; and the combining circuit/matching circuit 28.

Below the semiconductor substrate 77, a dielectric substrate 78 is formed. On the dielectric substrate 78, the double wave shorting/bias choke circuits 24a and 24b and the capacitors 27a and 27b are formed. Between the dielectric substrate 78 and a grounded layer which is a shield electrode of a dielectric substrate 79, the bypass capacitors 25a and 25b are formed. Below the dielectric substrate 78, the dielectric substrate 79 on which the shield electrode is formed is formed, and below the dielectric substrate 79, a dielectric substrate 80 is formed. On the dielectric substrate 80, the capacitors 31 and 32 and the inductor 30 are formed.

Figure 7:
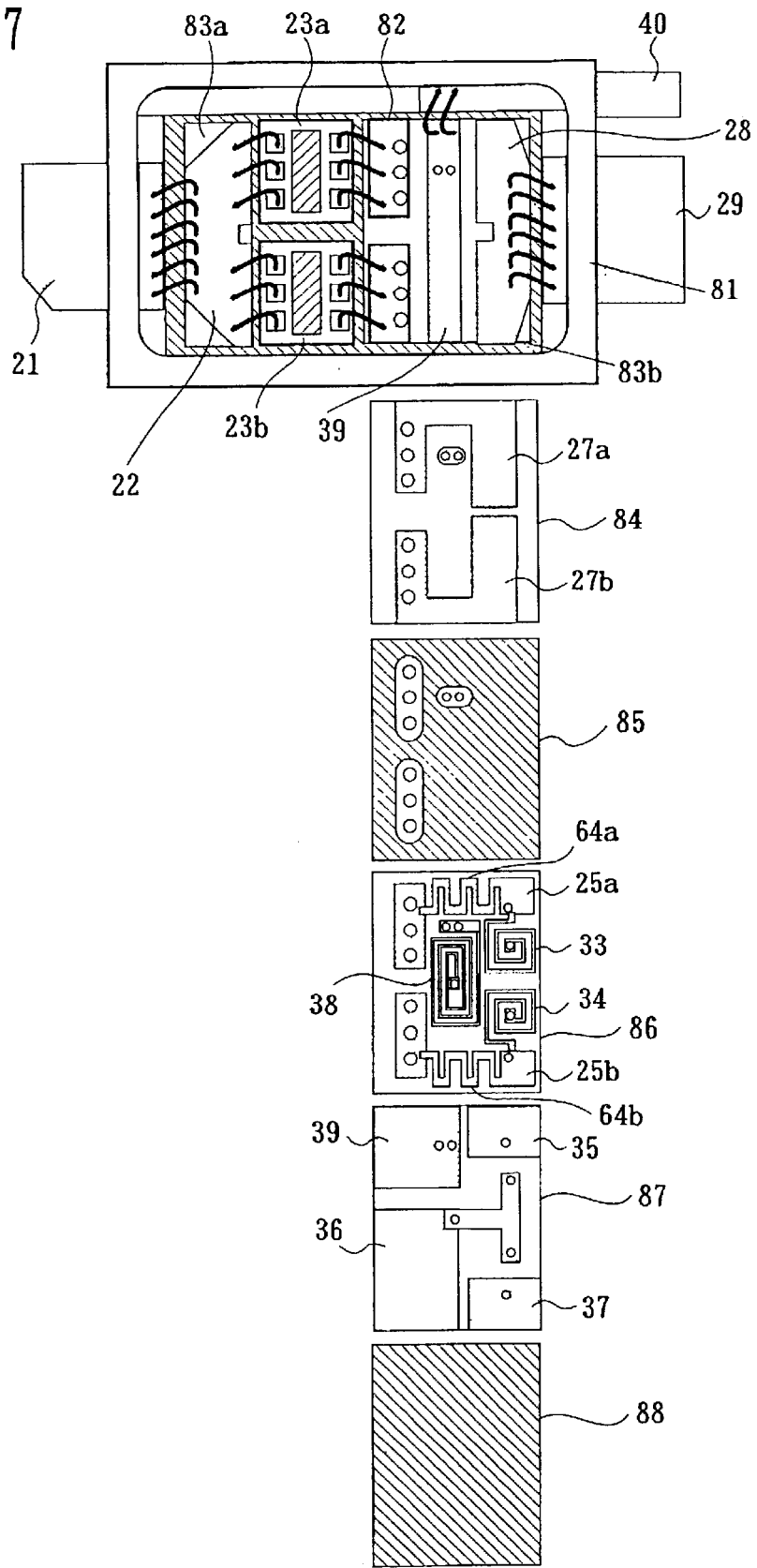
FIG. 7 is a view showing an example in which the power amplifier according to the first embodiment of the present invention is contained in a high-frequency ceramic package.

FIG. 7 shows an example in which the power amplifier 61 of the present embodiment is contained in a high-frequency ceramic package. The one shown in FIG. 7 is for high power and used for portable telephone base stations. The power amplifier 61 of FIG. 7 uses the circuit of FIG. 3.

A multilayer dielectric substrate where a semiconductor substrate 83a and dielectric substrates 83b and 84 to 88 are laminated in this order is mounted on an internal matching substrate 82 disposed in the high-frequency package 81, and the input terminal 21, an output terminal 20 and the bias supply terminal 40 are drawn out of the high-frequency package 81.

On the semiconductor substrate 83a, the following are formed: the matching circuit/splitting circuit 22; the FETs 23a and 23b; the capacitor 39; and the combining circuit/matching circuit 28. Below the dielectric substrate 83b, the dielectric substrate 84 is formed. On the dielectric substrate 84, the capacitors 27a and 27b are formed.

Below the dielectric substrate 84, the dielectric substrate 85 on which a shield electrode is formed is formed. Below the dielectric substrate 85, the dielectric substrate 86 is formed. On the dielectric substrate 86, the inductors 38, 33 and 34 and the double wave shorting/bias choke circuits 64a and 64b are formed. Between the dielectric substrate 86 and a grounded layer which is the shield electrode of the dielectric substrate 85, the bypass capacitors 25a and 25b are formed.

Below the dielectric substrate 86, the dielectric substrate 87 is formed. Between the dielectric substrate 87 and a grounded layer which is a shield electrode of the dielectric substrate 88, the capacitors 35, 36, 37 and 39 are formed. Below the dielectric substrate 87, the dielectric substrate 88 on which the shield electrode is formed is formed.

While in the present embodiment, the frequency of the signal of the frequency of the modulated wave is 1 GHz and the frequency band of the signal of the frequency of the modulating wave is 20 MHz, the present invention is not limited. As long as the frequency of the signal of the frequency of the modulated wave is not more than a thousand times the frequency band of the signal of the frequency band of the modulating wave, intermodulation distortion can be more excellently improved in the present embodiment than in the prior art.

Examples of the case where the frequency of the signal of the frequency of the modulated wave is not more than a thousand times the frequency band of the signal of the frequency band of the modulating wave as mentioned above include the following:

First, there is a case where CDMA 2000 is used as the communication mode. In this case, as the signal of the frequency of the modulated wave, a signal of a frequency of an 800 MHz band and a signal of a frequency of a 2 GHz band are used. When the signal of the frequency of the 800 MHz band is used as the signal of the frequency of the modulated wave in CDMA 2000, the frequency band of the signal of the frequency band of the modulating wave is 1.23 MHz, so that the frequency of the signal of the frequency of the modulated wave is not more than a thousand times the frequency band of the signal of the frequency band of the modulating wave. Consequently, intermodulation distortion can be excellently improved.

Moreover, the 2 GHz band of CDMA 2000 is a frequency band used specifically for data communication, and a plurality of channels is used to perform high-speed data communication. That is, for high-speed communication, data communication is performed by using a frequency band corresponding to a maximum of three channels, and when the frequency band corresponding to a maximum of three channels is used, the frequency band of the signal of the frequency band of the modulating wave is 3.69 MHz. As described above, the 2 GHz band in CDMA 2000 is used when data communication is performed with a personal computer and a terminal where the functions of a PDA and a portable telephone are integrated. In this case, the frequency of the signal of the frequency of the modulated wave is also not more than a thousand times the frequency band of the signal of the frequency band of the modulating wave, so that intermodulation distortion can be improved more excellently than in the prior art.

Moreover, in IEEE 802.11a which is a wireless LAN standard, a 5 GHz band is used as the frequency of the signal of the frequency of the modulated wave, and the frequency band of the signal of the frequency band of the modulating wave is 20 MHz, so that intermodulation distortion can be excellently improved like in the above-described cases.

Moreover, in so-called fourth-generation mobile communications, the 5 GHz band is used as the frequency of the signal of the frequency of the modulated wave, and the frequency band of the signal of the frequency band of the modulating wave is a 10 MHz band. Therefore, also in this case, since the frequency of the signal of the frequency of the modulated wave is not more than a thousand times the frequency band of the signal of the frequency band of the modulating wave, intermodulation distortion can be more excellently improved than in the prior art.

Moreover, broadcasting stations and relay stations of digital television broadcasting use frequencies of 400 MHz to 700 MHz as the frequency of the signal of the frequency of the modulated wave. The frequency band of the signal of the frequency band of the modulating wave is 6 MHz. Therefore, also in this case, since the frequency of the signal of the frequency of the modulated wave is not more than a thousand times the frequency band of the signal of the frequency band of the modulating wave, intermodulation distortion can be more excellently improved than in the prior art.

While in the present invention, the double wave shorting/bias choke circuits short-circuit the impedance at the frequency of the high-order harmonic of the frequency of the modulated wave, they may be designed so as to allow the signal of the frequency of the high-order harmonic of the frequency of the modulated wave to pass therethrough. In this case, a more excellent characteristic is obtained as a power amplifier.

As described above, according to the present invention, the overall size of the circuit can be reduced by integrating the double wave shorting/bias choke circuits 24a and 24b and the like, and the difference frequency phase inverting circuit 26 with one another, that is, integrating these circuits into one lamination.

Second Embodiment

Next, a second embodiment of the present invention will be described.

Figure 4:
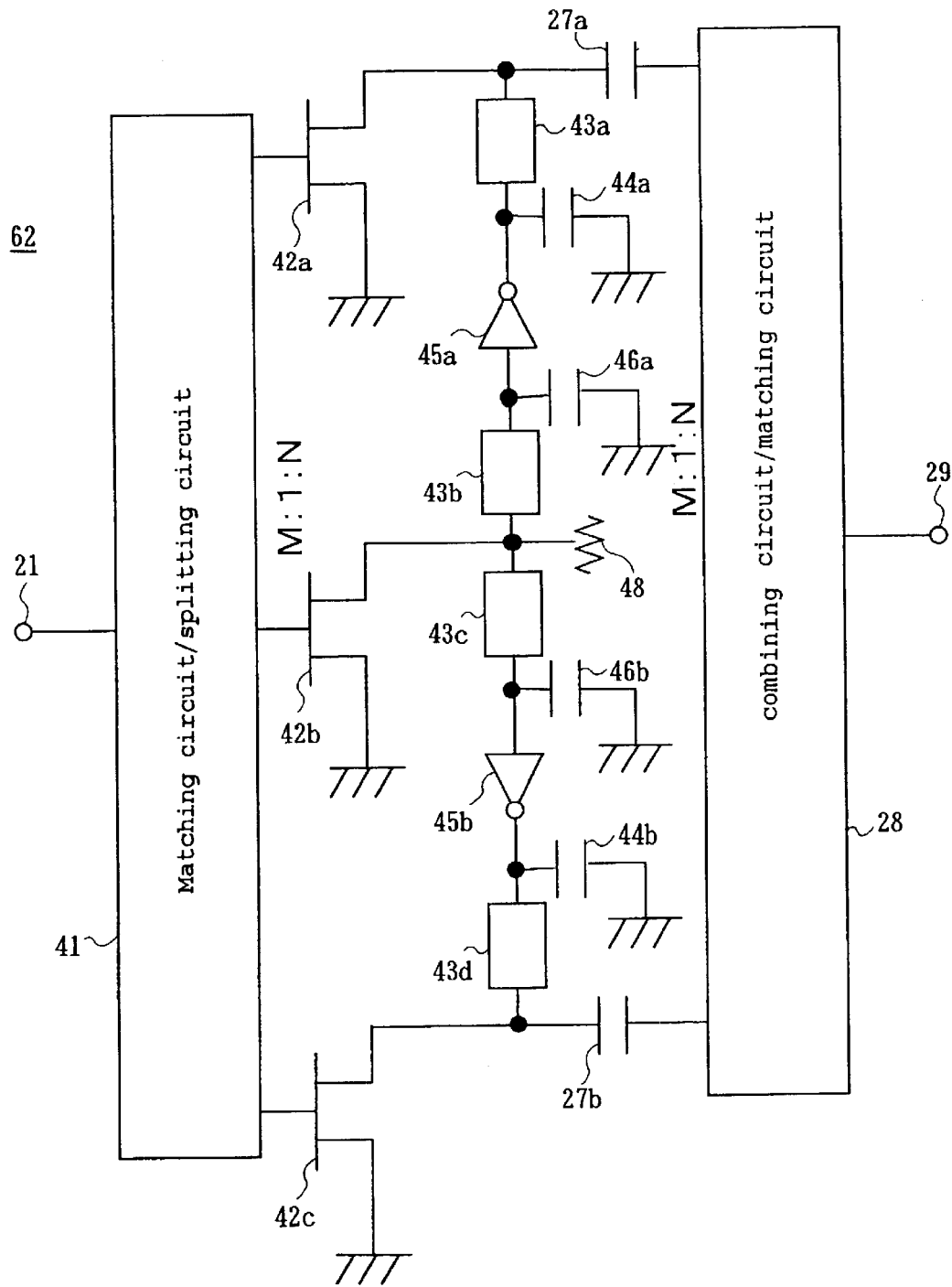
FIG. 4 is a view showing the structure of a power amplifier according to a second embodiment of the present invention.

FIG. 4 shows the structure of a power amplifier 62 according to the second embodiment.

The power amplifier 62 of the present embodiment is used, for example, as the power amplifier 5 of the radio circuit 63 of FIG. 9 described in the first embodiment.

To an input terminal 21 of the power amplifier 62, the input of a matching circuit/splitting circuit 41 is connected. To the three outputs of the matching circuit/splitting circuit 41, the gate of a FET 42a, the gate of a FET 42b and the gate of a FET 42c are connected, respectively.

The drain of the FET 42a is connected to one of the two inputs of a combining circuit/matching circuit 28 through a capacitor 27a for interrupting direct current. The drain of the FET 42c is connected to the other input of the combining circuit/matching circuit 28 through a capacitor 27b for interrupting direct current. The output of the combining circuit/matching circuit 28 is connected to an output terminal 29. The drain of the FET 42b is terminated by a terminating resistor 48.

The sources of the FETs 42a, 42b and 42c are grounded. To the drain of the FET 42a, one end of a double wave shorting circuit 43a is connected. Likewise, to the drain of the FET 42c, one end of a double wave shorting circuit 43d is connected. Moreover, to one output of a non-illustrated splitting circuit connected to the drain of the FET 42*b*, one end of a double wave shorting circuit 43*b* is connected, and to the other output of the splitting circuit, one end of a double wave shorting circuit 43*c* is connected.

Between the other end of the double wave shorting circuit 43*a* and the other end of the double wave shorting circuit 43*b*, an inverting amplifier 45*a* is connected. To the output and the input of the inverting amplifier 45*a*, one end of a capacitor 44*a* for bypassing a double wave and one end of a capacitor 46*a* for bypassing a double wave are connected, respectively. The other end of the capacitor 44*a* and the other end of the capacitor 46*a* are grounded.

Between the other end of the double wave shorting circuit 43*d* and the other end of the double wave shorting circuit 43*c*, an inverting amplifier 45*b* is connected. To the output and the input of the inverting amplifier 45*b*, one end of a capacitor 44*b* for bypassing a double wave and one end of a capacitor 46*b* for bypassing a double wave are connected, respectively. The other end of the capacitor 44*b* and the other end of the capacitor 46*b* are grounded.

The input terminal 21 is, like that of the first embodiment, a terminal to which the signal of the frequency of the modulated wave, which is the input signal, is input. The output terminal 29 is a terminal from which the amplified signal, which is the output signal, is output.

The matching circuit/splitting circuit 42 is a circuit that matches the impedance on the side of the input terminal 21 with each of the impedances on the gate sides of the FETs 42*a*, 42*b* and 42*c*, and splits into three the signal of the frequency of the modulated wave input from the input terminal 21 and inputs the split signals to the gates of the FETs 42*a*, 42*b* and 42*c*.

The FETs 42*a*, 42*b* and 42*c* are amplifying elements that amplify the power of the signal of the frequency of the modulated wave input to the gates thereof. It is assumed that the FET size of the FET 42*b* is smaller than those of the FET 42*a* and the FET 42*c*. Moreover, it is assumed that the FET 42*a* and the FET 42*c* have the same FET size.

The double wave shorting circuits 43*a*, 43*b*, 43*c* and 43*d* are circuits having a function of a filter that does not allow the signal of the frequency of the modulated wave (signal of a frequency of approximately 1 GHz) to pass therethrough and allows the signal of the frequency of the modulating wave (signal of a frequency of approximately 20 MHz) to pass therethrough, and a function of short-circuiting the impedance at the frequency of the high-order harmonic of the frequency of the modulated wave.

The inverting amplifiers 45*a* and 45*b* are circuits that amplify the signal of the frequency of the modulating wave while inverting the phase thereof 180 degrees.

The combining circuit/matching circuit 28 is a circuit that matches each of the impedances on the sides of the capacitors 27*a* and 27*b* with the impedance on the side of the output terminal 29, and combines the amplified signal having passed through the capacitor 27*a* with the amplified signal having passed through the capacitor 27*b* and outputs the composite signal to the output terminal 29.

Next, the operation of the present embodiment structured as described above will be described.

Assume now that the signal of the frequency of the modulated wave is input to the input terminal 21. As mentioned above, this signal is a signal of a frequency of 1 GHz where the frequency is distributed in a band of approximately the frequency of the modulating wave (20 MHz).

The signal of the frequency of the modulated wave input to the input terminal 21 is split into three by the matching circuit/splitting circuit 41, and the three split signals of the frequency of the modulated wave are input to the gate of the FET 42*a*, the gate of the FET 42*b* and the gate of the FET 42*c* from the outputs. At this time, the matching circuit/splitting circuit 41 matches the impedance on the side of the input terminal 21 to each of the impedances on the gate sides of the FETs 42*a*, 42*b* and 42*c*.

The signals of the frequency of the modulated wave output to the gates of the FETs 42*a*, 42*b* and 42*c* are amplified by the FETs 42*a*, 42*b* and 42*c* and output to the drains thereof.

While the FETs 42*a*, 42*b* and 42*c* have a linear characteristic like in the first embodiment, a nonlinear characteristic is conspicuous during high-efficiency operation. Because of the nonlinear characteristic, the amplified signals which are the signals of the frequency of the modulated wave amplified by the FETs 42*a*, 42*b* and 42*c* include a distortion component. Examples of this distortion component include a distortion component of the high-order harmonic of the signal of the frequency of the modulated wave (distortion component of a frequency of not less than approximately 2 GHz) a third-order intermodulation distortion component that appears at a frequency in the neighborhood of the frequency of the modulated wave (distortion component that appears in the neighborhood of 1 GHz) and a second-order intermodulation distortion component having a frequency which is the difference between different frequency components of the signal of the frequency of the modulated wave to be amplified (distortion component of a frequency of approximately 20 MHz).

The double wave shorting circuits 43*a*, 43*b*, 43*c* and 43*d* allow the second-order intermodulation distortion component, that is, the signal of the frequency of the modulating wave to pass therethrough, and short-circuit the signal of the frequency of the high-order harmonic so as to be totally reflected. Moreover, since the impedance is high at the frequency of the modulated wave, the double wave shorting circuits 43*a*, 43*b*, 43*c* and 43*d* do not allow the signal of the frequency of the modulated wave to pass therethrough.

Therefore, when the amplified signals including such a distortion component as well are output from the drains of the FETs 42*a* and 42*c*, of the amplifier signals, the second-order intermodulation distortion components pass through the double wave shorting circuits 43*a* and 43*d*, respectively.

On the other hand, when the amplified signal including such a distortion component is output from the drain of the FET 42*b*, of the amplified signal, the second-order intermodulation distortion component and the distortion component of the frequency of the high-order harmonic pass through the double wave shorting circuits 43*b* and 43*c*. Then, the signal of the frequency of the high-order harmonic is bypassed to ground by the capacitors 44*a* and 44*b* for interrupting a double wave. Moreover, of the amplified signal, the signal of the frequency of the modulated wave does not pass through the double wave shorting circuits 43*b* and 43*c* and is terminated by the terminating resistor 48.

The signal of the modulating frequency passes through the double wave shorting circuits 43*b* and 43*c* to be input to the inverting amplifiers 45*a* and 45*b*. The inverting amplifiers 45*a* and 45*b* amplify the input signals of the modulating frequency while inverting the phases of the signals 180 degrees.

The signal of the modulating frequency amplified by the inverting amplifier 45*a* passes through the double wave shorting circuit 43*a* to reach the drain end of the FET 42*a*. When passing through the double wave shorting circuit 43*a*, the signal of the frequency of the modulating wave is somewhat attenuated because of a loss at the double wave shorting circuit 43a.

The gain of the inverting amplifier 42a is previously adjusted so that the amplitude of the signal output from the inverting amplifier 45a after inverted and amplified by the inverting amplifier 45a which signal has passed through the double wave shorting circuit 43a while attenuated because of the loss at the double wave shorting circuit 43a and has reached the drain end of the FET 42a is the same as the amplitude of the signal of the frequency of the modulating wave included in the amplified signal output from the drain end of the FET 42a.

Therefore, the signal of the frequency of the modulating wave having reached the drain end of the FET 42a and the signal of the frequency of the modulating wave included in the amplified signal output from the drain end of the FET 42a are the same in amplitude and opposite in phase. Consequently, since these two signals of the frequency of the modulating wave cancel each other out, intermodulation distortion can be prevented from deteriorating due to the mixture of the signal of the frequency of the modulating wave which is a second-order intermodulation distortion component with the signal of the modulated wave at the drain of the FET 42b.

Likewise, the signal of the frequency of the modulating wave amplified by the inverting amplifier 45b passes through the double wave shorting circuit 43d to reach the drain end of the FET 42c. When passing through the double wave shorting circuit 43d, the signal of the frequency of the modulating wave is somewhat attenuated because of a loss at the double wave shorting circuit 43d.

The gain of the inverting amplifier 42b is previously adjusted so that the amplitude of the signal output from the inverting amplifier 45b after inverted and amplified by the inverting amplifier 45b which signal has passed through the double wave shorting circuit 43b while attenuated because of the loss at the double wave shorting circuit 43b and has reached the drain end of the FET 42c is the same as the amplitude of the signal of the frequency of the modulating wave included in the amplified signal output from the drain end of the FET 42c.

Therefore, the signal of the frequency of the modulating wave having reached the drain end of the FET 42c and the signal of the frequency of the modulating wave included in the amplified signal output from the drain end of the FET 42c are the same in amplitude and opposite in phase. Consequently, since these two signals of the frequency of the modulating wave cancel each other out, third-order intermodulation distortion can be prevented from deteriorating due to the mixture of the signal of the frequency of the modulating wave which is a second-order intermodulation distortion component with the signal of the modulated wave at the drain of the FET 42c.

The amplified signals output from the drains of the FET 42a and the FET 42c, like in the first embodiment, have their impedances matched and are combined with each other by the combining circuit/matching circuit 28, and are output to the output terminal 29.

As described above, in the power amplifier 62 of the present embodiment, since the signals of the frequency of the modulating wave cancel each other out at the drain ends of the FET 42a and the FET 42b, intermodulation distortion can be prevented from deteriorating due to the mixture of the signal of the frequency of the modulating wave with the signal of the frequency of the modulating wave at the drains.

Further, in the power amplifier 62 of the present embodiment, even when the signals of the frequency of the modulating wave are attenuated because of a loss at the double wave shorting circuits 43a, 43b, 43c and 43d, since the signals of the frequency of the modulating wave are amplified by the inverting amplifiers 45a and 45b, the two signals of the frequency of the modulating wave can be made the same in amplitude and opposite in phase at the drain ends of the FET 42a and the FET 42b. Consequently, a low-distortion characteristic can be obtained in a wide band using the linearity of the FET 42a and the like as much as possible.

Further, by the FET size of the FET 42b being smaller than those of the FET 42a and the FET 42c and increasing the gains of the inverting amplifiers 42a and 42b accordingly, the signal of the frequency of the modulated wave input to the FET 42b can be reduced, so that the efficiency of the power amplifier 62 can be improved. Further, in such a case, the amplified signal output from the drain of the FET 42b is weaker than those output from the drains of the FET 42a and the FET 42c. Consequently, when the amplified signal of the FET 42b is output from the output terminal 29 being combined with the amplified signals output from the FET 42a and the FET 42c instead of being terminated by the terminating resistor 48, the distortion component hardly increases on average. Therefore, the amplified signal of the FET 42b may be output from the output terminal 29 being combined with the amplified signals output from the FET 42a and the FET 42c instead of being terminated by the terminating resistor 48.

Figure 8:
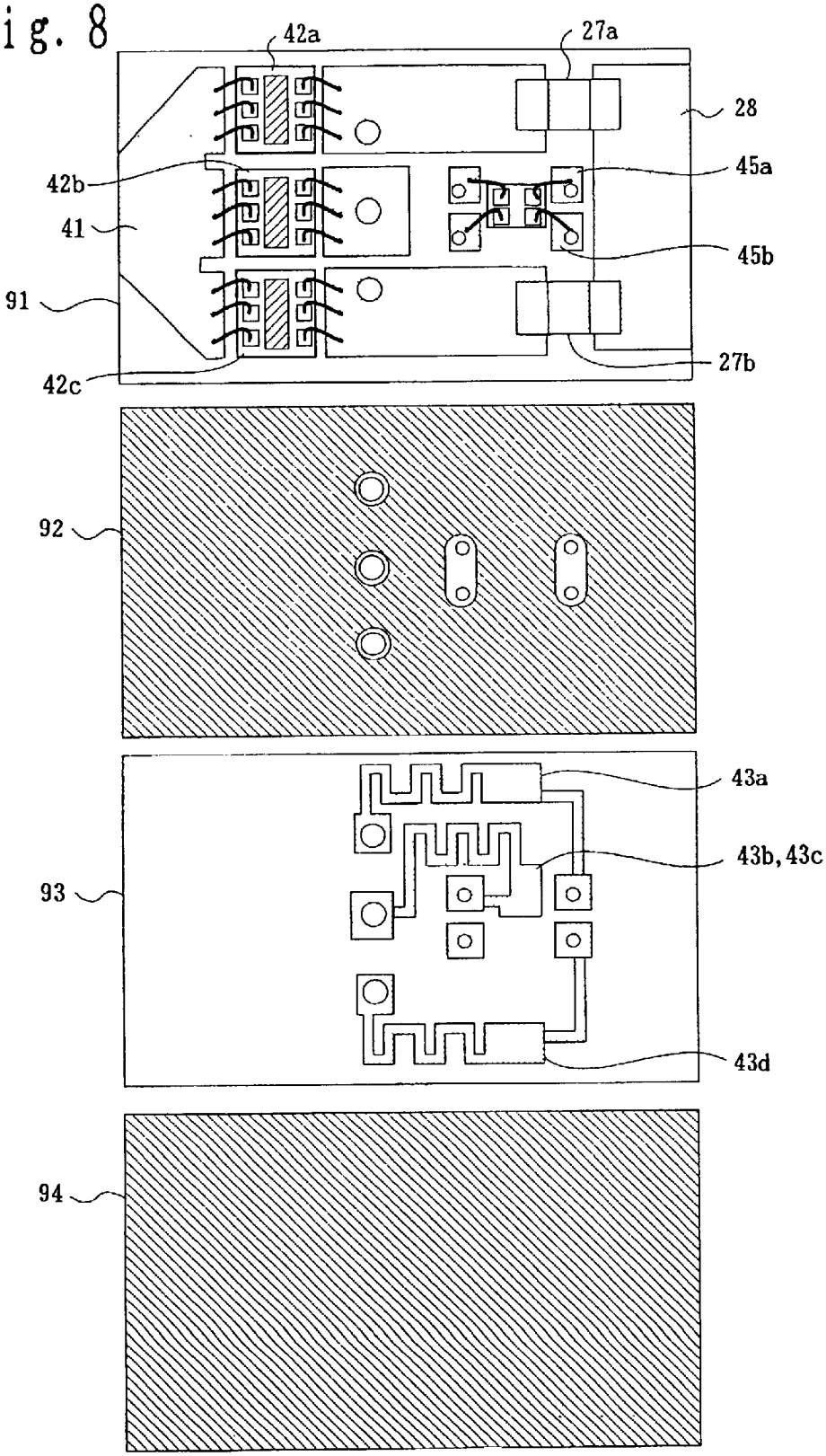
FIG. 8 is a view showing an example in which the power amplifier according to the second embodiment of the present invention is formed within a multilayer dielectric substrate.

FIG. 8 shows an example in which the power amplifier 62 of the present embodiment is formed within a multilayer dielectric substrate.

On a dielectric substrate 91, the following are formed: the matching circuit/splitting circuit 41; the FETs 42a, 42b and 42c; the inverting amplifiers 42a and 45b; the capacitors 27a and 27b which are chip condensers; and the combining circuit/matching circuit 28. Below the dielectric substrate 91, a dielectric substrate 92 on which a shield electrode is formed is formed.

Below the dielectric substrate 92, a dielectric substrate 93 is formed. On the dielectric substrate 93, the double wave shorting circuits 43a, 43b, 43c and 43d are formed. Between the dielectric substrate 93 and a grounded layer which is a shield electrode of a dielectric substrate 94, the capacitors 44a, 44b, 46a and 46b are formed. Below the dielectric substrate 92, the dielectric substrate 94 on which the shield electrode is formed is formed.

While the FET sizes of the FET 42a and the FET 42b are the same in the present embodiment, the present invention is not limited thereto. The FET sizes of the FET 42a and the FET 42c may be different. In this case, it is preferable that the FET size of the FET 42b be smaller than the smaller one of the FET sizes of the FET 42a and the FET 42c.

Further, instead of the terminating resistor 48 of the present embodiment, the following may be used: a terminating load comprising a combination of a capacitor, an inductor and a resistor; a terminating load comprising a combination of a capacitor and a resistor; a terminating load comprising a combination of an inductor and a resistor; and a terminating load comprising a combination of a capacitor and an inductor.

Similar effects to those obtained from the present embodiment can be obtained from a power amplifier in which the FET 42c, the double wave shorting circuits 43c and 43d, the inverting amplifier 45b, the capacitors 45b and 46b and the capacitor 27b of the power amplifier 62 of the second embodiment are not provided.

That is, in FIG. 4, the matching circuit/splitting circuit 41 is replaced with a matching circuit/splitting circuit that splits the input into two, and the combining circuit/matching circuit 28 is replaced with a matching circuit that outputs the amplified signal having passed through the capacitor 27a to the output terminal 29 and matches the impedance thereof. Similar effects as those obtained from the present embodiment can also be obtained by doing this.

Further, while in the inverting amplifier 62 of the second embodiment, the FETs 42a and 42c whose amplified signals are output to the output terminal are two in number and the FET 42b for canceling out the signal of the frequency of the modulating wave is one in number, the present invention is not limited thereto. The power amplifier may have one FET for canceling out the signal of the frequency of the modulating wave and a number (N−1) of FETs whose amplified signals are output to the output terminal. In this case, to each of the gates of the number (N−1) of FETs, the corresponding output of a matching circuit/splitting circuit that splits the signal of the frequency of the modulated wave into a number N is connected. To the gate of the FET for canceling out the signal of the frequency of the modulating wave, the remaining output of the matching circuit/splitting circuit is connected. Between each of the number (N−1) of FETs and the FET for canceling out the signal of the frequency of the modulating wave, a circuit having an equal structure to that of the circuit part of the double wave shorting circuit 43b, the capacitor 46a, the inverting amplifier 45a, the capacitor 44a, the double wave shorting circuit 43a and the capacitor 27a of FIG. 4 is connected. Moreover, the signal output from each of the number (N−1) of FETs passes through a capacitor, equivalent to the capacitor 27a, of each FET and is output to the output terminal 29 from a combining circuit/matching circuit that combines a number (N−1) of inputs and matches the impedances thereof.

Further, while in the present embodiment, at the drain of the FET 42b, the double wave shorting circuit 43b and the double wave shorting circuit 43c are provided on the circuit lines reaching the FETs 42a and 42c, the present invention is not limited thereto. A structure may be used such that one end of a double wave shorting circuit is connected to the drain of the FET 42b and the other end of the double wave shorting circuit is connected to the input of the inverting amplifier 45a and the input of the inverting amplifier 45b. In such a power amplifier, a number (N−1) of FETs whose amplified signals are output to the output terminal may be provided as mentioned above. By doing this, the number of double wave shorting circuits can be reduced.

As described above, of the elements on the circuit lines reaching from the drain of the FET 42b to the FETs 42a and 42c, the double wave shorting circuit 43b and the double wave shorting circuit 43c may be replaced with one common element, and further, all or some of the elements on the lines reaching from the drain of the FET 42b to the FET 42a and the FET 42c may be further replaced with one common element.

For example, the double wave shorting circuit 43b and the capacitor 46a of the elements on the line reaching from the drain of the FET 42b to the drain of the FET 42a and the double wave shorting circuit 43c and the capacitor 36c of the circuit part reaching from the drain of FET 42b to the drain of the FET 42c may each be replaced with one common element. That is, one end of the double wave shorting circuit is connected to the drain of the FET 42b, and the output from the other end of the double wave shorting circuit is split into two by a non-illustrated splitting circuit. One of the two split outputs is connected to the input of the inverting amplifier 42a, and the other output is connected to the input of the inverting amplifier 45b. Moreover, to the other end of the double wave shorting circuit, one end of the capacitor replacing the capacitors 46a and 46b is connected, and the other end of the capacitor is grounded.

Moreover, for example, the double wave shorting circuit 43b, the capacitor 46a and the inverting amplifier 45a of the circuit part on the line reaching from the drain of the FET 42b to the drain of the FET 42a and the double wave shorting circuit 43c, the capacitor 46b and the inverting amplifier 46b of the circuit part on the line reaching from the drain of the FET 42b to the drain of the FET 42c may each be replaced with one common element. That is, one end of the double wave shorting circuit is connected to the drain of the FET 42b, one end of the capacitor and the input of the inverting amplifier are connected to the other end of the double wave shorting circuit, the other end of the capacitor is grounded, the input of a non-illustrated splitting circuit is connected to the output of the inverting amplifier, the output split into two by the slitting circuit is connected to the other end of the double wave shorting circuit 43a and the other end of the double wave shorting circuit 43d, and the capacitors 44a and 44b are connected to the other ends of the double wave shorting circuits 43a and 43d.

Moreover, for example, the double wave shorting circuit 43b, the capacitor 46a, the inverting amplifier 45a and the capacitor 44a of the circuit part reaching from the drain of the FET 42b to the drain of the FET 42a and the double wave shorting circuit 43c, the capacitor 46b, the inverting amplifier 46b and the capacitor 44b of the circuit part reaching from the drain of the FET 42b to the drain of the FET 42c may each be replaced with one common element. That is, one end of the double wave shorting circuit is connected to the drain of the FET 42b, one end of one of the capacitors and the input of the inverting amplifier are connected to the other end of the double wave shorting circuit, the other end of the capacitor is grounded, the other capacitor and the input of a non-illustrated splitting circuit are connected to the output of the inverting amplifier, the other end of the capacitor is grounded, and the output split into two by the splitting circuit is connected to the other end of the double wave shorting circuit 43a and the other end of the double wave shorting circuit 43d.

Moreover, for example, the double wave shorting circuit 43b, the capacitor 46a, the inverting amplifier 45a, the capacitor 44a and the double wave shorting circuit 43a of the circuit part reaching from the drain of the FET 42b to the drain of the FET 42a and the double wave shorting circuit 43c, the capacitor 46b, the inverting amplifier 46b, the capacitor 44b and the double wave shorting circuit 43d of the circuit part reaching from the drain of the FET 42b to the drain of the FET 42c may each be replaced with one common element. That is, one end of one of the double wave shorting circuits is connected to the drain of the FET 42b, one end of one of the capacitors and the input of the inverting amplifier are connected to the other end of the double wave shorting circuit, the other end of the capacitor is grounded, the other capacitor and the other end of the other double wave shorting circuit are connected to the output of the inverting amplifier, the input of a non-illustrated splitting circuit is connected to the other end of the double wave shorting circuit, and the output split into two by the splitting circuit is connected to the drain of the FET 42a and the drain of the FET 42c.

It is to be noted that in such a power amplifier, a number (N−1) of FETs whose amplified signals are output to the output terminal may be provided as mentioned above.

Further, the power amplifier may comprise a combination of a plurality of power amplifiers described in the first embodiment and the second embodiment.

For example, that two power amplifiers 62 of FIG. 4 are combined means that the matching circuits/splitting circuits 41 of the two power amplifiers 62 are replaced with one common element. That is, that the matching circuits/splitting circuits 41 are replaced with one common element means that the two matching circuits/splitting circuits 41 are realized as one matching circuit/splitting circuit. The common matching circuit/splitting circuit receives the signal of the frequency of the modulated wave through one input terminal 21 and splits the signal into six. Of the six, three outputs are input to the FETs of one of the power amplifiers 62, and the remaining three outputs are input to the FETs of the other power amplifier 62.

The combining circuits/matching circuits 28 are similarly replaced with one common element. That is, that the combining circuits/matching circuits 28 are replaced with one common element means that the two combining circuits/matching circuits 28 are realized as one circuit. The common combining circuit/matching circuit 28 combines four amplified signals and outputs the composite signal to one input terminal 29, and matches the impedances thereof. The amplified signals having passed through the capacitors 27a and 27b of one of the power amplifiers 62 are input to two inputs of the common combining circuit/matching circuit, and the amplified signals having passed through the capacitors 27a and 27b of the other power amplifier 62 are input to the remaining two inputs of the common combining circuit/matching circuit 28. These four amplified signals are combined by the common combining circuit/matching circuit, have their impedances matched, and are output from one output terminal 29.

By doing this, a power amplifier comprising a combination of a plurality of and/or a plurality of kinds of the following can also be obtained: the power amplifier 61 of the first embodiment; the power amplifier 62 of the second embodiment; and the power amplifier which is a modification of the power amplifier 62 described in the second embodiment. As the matching circuit/splitting circuit of the power amplifier comprising a combination of a plurality of and/or a plurality of kinds of power amplifiers of the embodiments as mentioned above, one common circuit replacing the matching circuits/splitting circuits of the combined power amplifiers is used like in the description given above. Likewise, as the combining circuit/matching circuit of the power amplifier comprising a plurality of and/or a plurality of kinds of power amplifiers of the embodiments, one common circuit replacing the combining circuits/matching circuits of the combined power amplifiers is used. As described above, similar effects to those obtained from the embodiments can be obtained from the power amplifiers comprising a combination of power amplifiers of the embodiments.

The FETs of the embodiments are an example of the amplifying elements of the present invention. The double wave shorting circuits of the embodiments are an example of the filters of the present invention. The FET 23a of the embodiment is an example of the first amplifying element of the present invention. The FET 23b of the embodiment is an example of the second amplifying element of the present invention. The double wave shorting/bias choke circuit 24a of the embodiment is an example of the first filter of the present invention. The double wave shorting/bias choke circuit 24b of the embodiment is an example of the second filter of the present invention. The FET 42a of the embodiment is an example of the first amplifying element of the present invention. The FET 42c of the embodiment is an example of the first amplifying element of the present invention. The FET 42b of the embodiment is an example of the second amplifying element of the present invention.

The amplifying elements of the present invention are not limited to the FETs of the embodiments and may be other kinds of amplifying elements such as transistors.

Further, examples of the radio communication apparatus of the present invention include mobile radio apparatuses such as portable telephones, PHSs (personal handyphone systems), car telephones, train radio telephones, maritime mobile radio telephones, aeronautical radio telephones, cordless telephones and radio pagers, and base station apparatuses thereof.

As is apparent from the description given above, the present invention is capable of providing a power amplifier, a power amplifying method capable of reducing the impedance of the circuit part on the output side of the amplifying element at the frequency of the modulating wave in a structure different from that of the conventional power amplifier, and a radio communication apparatus.

Moreover, the present invention is capable of providing a power amplifier, a power amplifying method capable of making lower the impedance of the circuit part on the output side of the amplifying element at the frequency of the modulating wave and of more effectively using the linearity of the amplifying element, and a radio communication apparatus.

What is claimed is:

1. A power amplifier comprising:
   a splitting circuit splitting a signal of a frequency of a modulated wave into two;
   a first amplifying element having its input connected to one output of said splitting circuit;
   a second amplifying element having its input connected to the other output of said splitting circuit;
   a combining circuit combining an output of said first amplifying element with an output of said second amplifying element to output a composite signal;
   a first filter having one end connected to the output of said first amplifying element, said first filter not allowing the signal of the frequency of the modulated wave to pass therethrough and allowing a signal of a frequency band of a modulating wave of the signal of the frequency of the modulated wave to pass therethrough;
   a second filter having one end connected to the output of said second amplifying element, said second filter not allowing the signal of the frequency of the modulated wave to pass therethrough and allowing the signal of the frequency band of the modulating wave of the signal of the frequency of the modulated wave to pass therethrough; and
   an phase inverting circuit connected between the other end of said first filter and the other end of said second filter, said phase inverting circuit allowing the signal of the frequency band of the modulating wave to pass therethrough while inverting a phase of the signal of the frequency of the modulated wave.

2. A power amplifier according to claim 1,
   wherein said phase inverting circuit comprises an inductor and a capacitor.

3. A power amplifier according to claim 2,
   wherein said phase inverting circuit comprises:
      an inductor having one end connected to the other end of said first filter and having its other end connected to the other end of said second filter;
      a first capacitor having one end connected to one end of said inductor and having its other end grounded; and a second capacitor having one end connected to the other end of said inductor and having its other end grounded, and wherein one end of said phase inverting circuit is one end of said inductor, and the other end of said phase inverting circuit is the other end of said inductor.

4. A power amplifier according to claim 1, further comprising a bias choke circuit connected at least one of said first filter, said second filter and said phase inverting circuit, said bias choke circuit supplying a bias voltage.

5. A power amplifier according to claim 2, wherein said phase inverting circuit comprises:
a first inductor;
a second inductor;
a first capacitor;
a second capacitor; and
a third capacitor, wherein said first inductor has one end connected to the other end of said first filter and has its other end connected to one end of said second inductor, said second inductor has its other end connected to the other end of said second filter, said first capacitor has one end connected to the one end of said first inductor and has its other end grounded, said second capacitor has one end connected to the other end of said first inductor and has its other end grounded, and said third capacitor has one end connected to the other end of said second inductor and has its other end grounded, and wherein one end of said phase inverting circuit is one end of said first inductor and the other end of said phase inverting circuit is the other end of said second inductor.

6. A power amplifier according to claim 5, wherein said phase inverting circuit comprises:
a fourth inductor having one end connected to a bias supply and having its other end connected to the other end of said first inductor; and
a fourth capacitor connected to one end of said fourth inductor and having its other end grounded.

7. A power amplifier comprising:

a splitting circuit splitting a signal of a frequency of a modulated wave into at least two;

a first amplifying element having its input connected to one output of said splitting circuit;

a second amplifying element having its input connected to the other output of said splitting circuit;

a first filter having one end connected to an output of said first amplifying element, said first filter not allowing the signal of the frequency of the modulated wave to pass therethrough and allowing a signal of a frequency band of a modulating wave of the modulated wave to pass therethrough;

a second filter having one end connected to an output of said second amplifying element, said second filter not allowing the signal of the frequency of the modulated wave to pass therethrough and allowing the signal of the frequency band of the modulating wave to pass therethrough; and an inverting amplifier having its output connected to the other end of said first filter and having its input connected to the other end of the second filter, said inverting amplifier amplifying the signal of the frequency band of the modulating wave while inverting a phase of the signal of the frequency band of the modulating wave, wherein at least said output of said first amplifying element is output to an outside.

8. A power amplifier comprising:

a splitting circuit splitting a signal of a frequency of a modulated wave into a number N (N is an integer not less than 3);

a number (N−1) of first amplifying elements having their inputs connected to a number (N−1) of outputs of a number N of outputs of said splitting circuit;

a second amplifying element having its input connected to an output of said splitting circuit other than the number (N−1) of outputs of said splitting circuit;

a first filter having one end connected to inputs of a (N−1) splitting circuit splitting its input into a number (N−1) and having their outputs connected to outputs of said number (N−1) of first amplifying elements, said first filter not allowing the signal of the frequency of the modulated wave to pass therethrough and allowing a signal of a frequency band of a modulating wave of the modulated wave to pass therethrough;

a second filter having one end connected to an output of said amplifying element, said second filter not allowing the signal of the frequency of the modulated wave to pass therethrough and allowing the signal of the frequency band of the modulating wave to pass therethrough;

an inverting amplifier having its input connected to the other end of said second filter and having its output connected to the other end of said first filter, said inverting amplifier amplifying the signal of the frequency band of the modulating wave while inverting a phase of the signal of the frequency band of the modulating wave; and a combining circuit combining at least the outputs of said number (N−1) of first amplifying elements to output a composite signal.

9. A power amplifier comprising:

a splitting circuit splitting a signal of a frequency of a modulated wave into a number N (N is an integer not less than 3);

a number (N−1) of first amplifying elements having their inputs connected to a number (N−1) of outputs of a number N of outputs of the splitting circuit;

a second amplifying element having its input connected to an output of said splitting circuit other than the number (N−1) of outputs of said splitting circuit;

a number (N−1) of first filters having one ends connected to outputs of said number (N−1) of first amplifying elements, said first filters not allowing the signal of the frequency of the modulated wave to pass therethrough and allowing a signal of a frequency band of a modulating wave of the modulated wave to pass therethrough;

a second filter having one end connected to an output of said second amplifying element, said second filter not allowing the signal of the frequency of the modulated wave to pass therethrough and allowing the signal of the frequency band of the modulating wave to pass therethrough;

an inverting amplifier having its input connected to the other end of said second filter, said inverting amplifier amplifying the signal of the frequency band of the modulating wave while inverting a phase of the signal of the frequency band of the modulating wave; and a combining circuit combining at least the outputs of said number (N−1) of first amplifying elements to output a composite signal, wherein said other ends of said number (N−1) of first filters are connected to the number (N−1) of outputs of a (N−1) splitting circuit splitting its input into a number (N−1) and connected to an output of said inverting amplifier.

10. A power amplifier comprising:

a splitting circuit splitting a signal of a frequency of a modulated wave into a number N (N is an integer not less than 3);

a number (N−1) of first amplifying elements having their inputs connected to a number (N−1) of outputs of a number N of outputs of said splitting circuit;

a second amplifying element having its input connected to an output of said splitting circuit other than the number (N−1) of outputs of said splitting circuit;

a number (N−1) of first filters having one ends connected to outputs of said number (N−1) of first amplifying elements, said first filters not allowing the signal of the frequency of the modulated wave to pass therethrough and allowing a signal of a frequency band of a modulating wave of the modulated wave to pass therethrough;

a second filter having one end connected to an output of said second amplifying element, said second filter not allowing the signal of the frequency of the modulated wave to pass therethrough and allowing the signal of the frequency band of the modulating wave to pass therethrough;

a number (N−1) of inverting amplifiers having their outputs connected to the other ends of said number (N−1) of first filters and having their inputs connected to the number (N−1) of outputs of a (N−1) splitting circuit splitting its input into a number (N−1) and having their inputs connected to the other end of said second filter, said inverting amplifiers amplifying the signal of the frequency band of the modulating wave while inverting a phase of the signal of the frequency band of the modulating wave; and a combining circuit combining at least the outputs of said number (N−1) of first amplifying elements to output a composite signal.

11. A power amplifier comprising:

a splitting circuit splitting a signal of a frequency of a modulated wave into a number N (N is an integer not less than 3);

a number (N−1) of first amplifying elements having their inputs connected to a number (N−1) of outputs of a number N of outputs of said splitting circuit;

a second amplifying element having its input connected to an output of said splitting circuit other than the number (N−1) of outputs of said splitting circuit;

a number (N−1) of first filters having one ends connected to outputs of said number (N−1) of first amplifying elements, said first filters not allowing the signal of the frequency of the modulated wave to pass therethrough and allowing a signal of a frequency band of a modulating wave of the modulated wave to pass therethrough;

a number (N−1) of inverting amplifiers having their outputs connected to the other ends of said number (N−1) of first filters, said inverting amplifiers amplifying the signal of the frequency band of the modulating wave while inverting a phase of the signal of the frequency band of the modulating wave;

a number (N−1) of second filters having one end connected to inputs of said number (N−1) of inverting amplifiers and having its other end connected to the number (N−1) of outputs of a (N−1) splitting circuit splitting its input into a number (N−1) and connected to an output of said second amplifying element, said second filters not allowing the signal of the frequency of the modulated wave to pass therethrough and allowing the signal of the frequency band of the modulating wave to pass therethrough; and a combining circuit combining at least the outputs of said number (N−1) of first amplifying elements to output a composite signal.

12. A power amplifier according to any one of claims 7 to 11, wherein said output of said second amplifying element is terminated.

13. A power amplifier according to claim 12, wherein that said output of said second amplifying element is terminated means that a terminating resistor is connected to the output of said second amplifying element or that a terminating load comprising a capacitor and/or an inductor is connected to the output of said second amplifying element.

14. A power amplifier according to any one of claims 7 to 11, wherein said second amplifying element is smaller in amplifying element size than said first amplifying element.

15. A power amplifier comprising a plurality of power amplifiers according to any one of claims 1 to 6 and 8 to 11, wherein said splitting circuits of said power amplifiers are replaced with one common element, and the same signal of the frequency of the modulated wave is input, and wherein said combining circuits of said power amplifiers are replaced with one common element, and outputs one output signal generated by signal combination.

16. A power amplifier comprising:

a plurality of power amplifiers according to claim 7; and a combining circuit generating by signal combination an output to be output to an outside of said power amplifiers, and outputting the output, wherein said splitting circuits of said power amplifiers are replaced with one common element, and the same signal of the frequency of the modulated wave is input.

17. A power amplifier having a multilayer dielectric substrate where the power amplifier according to any one of claims 1 to 11 is formed.

18. A power amplifier according to claim 17, wherein said multilayer dielectric substrate comprises: a semiconductor substrate disposed thereabove; and a multilayer dielectric substrate disposed below said semiconductor substrate.

19. A power amplifier according to claim 18, comprising an internal matching substrate in which said multilayer dielectric substrate is disposed.

20. A power amplifier according to any one of claims 1 to 11, wherein a frequency of the signal of the frequency of the modulated wave is not more than a thousand times a frequency band of the signal of the frequency band of the modulating wave.

21. A power amplifier according to any one of claims 1 to 11, wherein said first filter and said second filter allow a harmonic component of the signal of the frequency of the modulating wave to pass therethrough.

22. A radio communication apparatus having at least a transmitting circuit outputting a transmission wave,
   wherein said power amplifier according to any one of claims 1 to 11 is used for said transmitting circuit.

23. A power amplifying method comprising the steps of:
   a splitting step splitting a signal of a frequency of a modulated wave into two;
   a first amplifying step amplifying one input generated by said splitting step;
   a second amplifying step amplifying the other output generated by said splitting step;
   a combining step combining an output generated by said first amplifying step with an output generated by said second amplifying step to output a composite signal;
   a first filtering step receiving the output generated by said first amplifying step and not allowing the signal of the frequency of the modulated wave to pass therethrough and allowing a signal of a frequency band of a modulating wave of the signal of the frequency of the modulated wave to pass therethrough;
   a second filtering step receiving the output generated by said second amplifying step and not allowing the signal of the frequency of the modulated wave to pass therethrough and allowing the signal of the frequency band of the modulating wave of the signal of the frequency of the modulated wave to pass therethrough; and
   a phase inverting step receiving the signals passed in said first filtering step and said second filtering step and allowing the signal of the frequency band of the modulating wave to pass therethrough while inverting a phase of the signal of the frequency of the modulating wave.

24. A power amplifying method comprising the steps of:
   a splitting step splitting a signal of a frequency of a modulated wave into at least two;
   a first amplifying step amplifying one output generated by said splitting step;
   a second amplifying step amplifying the other output generated by said splitting step;
   a first filtering step receiving an output generated by said first amplifying step and not allowing the signal of the frequency of the modulated wave to pass therethrough and allowing a signal of a frequency band of a modulating wave of the modulated wave to pass therethrough;
   a second filtering step receiving an output of said second amplifying step and not allowing the signal of the frequency of the modulated wave to pass therethrough and allowing the signal of the frequency band of the modulating wave to pass therethrough; and
   an inverting amplifying step receiving the signals passed in said first filtering step and said second filtering step and amplifying the signal of the frequency band of the modulating wave while inverting a phase of the signal of the frequency band of the modulating wave,
   wherein at least said output of generated by said first amplifying step is output to an outside.

25. A power amplifying method comprising the steps of:
   a splitting step splitting a signal of a frequency of a modulated wave into a number N (N is an integer not less than 3);
   a number (N−1) of first amplifying steps amplifying a number (N−1) of outputs of a number N of outputs generated by said splitting step;
   a second amplifying step amplifying an output generated by said splitting step other than the number (N−1) of outputs generated by said splitting step;
   a first filtering step not allowing the signal of the frequency of the modulated wave to pass therethrough and allowing a signal of a frequency band of a modulating wave of the modulated wave to pass therethrough and sending the signal to a (N−1) splitting step splitting its input into a number (N−1) and sending their outputs to outputs generated by said number (N−1) of first amplifying steps;
   a second filtering step receiving an output generated by said second amplifying step and not allowing the signal of the frequency of the modulated wave to pass therethrough and allowing the signal of the frequency band of the modulating wave to pass therethrough;
   an inverting amplifying step receiving the signals passed in said first filtering step and said second filtering step and amplifying the signal of the frequency band of the modulating wave while inverting a phase of the signal of the frequency band of the modulating wave; and
   a combining step combining at least the outputs generated by said number (N−1) of first amplifying steps to output a composite signal.

26. A power amplifying method comprising the steps of:
   a splitting step splitting a signal of a frequency of a modulated wave into a number N (N is an integer not less than 3);
   a number (N−1) of first amplifying steps amplifying a number (N−1) of outputs of a number N of outputs generated by the splitting step;
   a second amplifying step amplifying an output generated by said splitting step other than the number (N−1) of outputs generated by said splitting step;
   a number (N−1) of first filtering steps receiving outputs generated by said number (N−1) of first amplifying steps and not allowing the signal of the frequency of the modulated wave to pass therethrough and allowing a signal of a frequency band of a modulating wave of the modulated wave to pass therethrough;
   a second filtering step receiving an output generated by said second amplifying step and not allowing the signal of the frequency of the modulated wave to pass therethrough and allowing the signal of the frequency band of the modulating wave to pass therethrough;
   an inverting amplifying step receiving the signals passed in said second filtering step and amplifying the signal of the frequency band of the modulating wave while inverting a phase of the signal of the frequency band of the modulating wave; and
   a combining step combining at least the outputs generated by said number (N−1) of first amplifying steps to output a composite signal,
   wherein said number (N−1) of first filtering steps pass the signal to the number (N−1) of outputs generated by a (N−1) splitting step splitting its input into a number (N−1) and receiving an output generated by said inverting amplifying step.

27. A power amplifying method comprising the steps of:
   a splitting step splitting a signal of a frequency of a modulated wave into a number N (N is an integer not less than 3);
   a number (N−1) of first amplifying steps amplifying a number (N−1) of outputs of a number N of outputs generated by said splitting step;

a second amplifying step amplifying an output generated by said splitting step other than the number (N−1) of outputs generated by said splitting step;

a number (N−1) of first filtering steps receiving said number (N−1) of outputs generated by first amplifying steps and not allowing the signal of the frequency of the modulated wave to pass therethrough and allowing a signal of a frequency band of a modulating wave of the modulated wave to pass therethrough;

a second filtering step receiving an output generated by said second amplifying step and not allowing the signal of the frequency of the modulated wave to pass therethrough and allowing the signal of the frequency band of the modulating wave to pass therethrough;

a number (N−1) of inverting amplifying steps amplifying the signal of the frequency band of the modulating wave while inverting a phase of the signal of the frequency band of the modulating wave and sending their outputs to said number (N−1) of first filtering steps and receiving the number (N−1) of outputs generated by a (N−1) splitting steps splitting its input into a number (N−1) and receiving the signal passed in said second filtering step; and a combining step combining at least the outputs generated by said number (N−1) of first amplifying steps to output a composite signal.

28. A power amplifying step comprising the steps of:

a splitting step splitting a signal of a frequency of a modulated wave into a number N (N is an integer not less than 3);

a number (N−1) of first amplifying steps amplifying a number (N−1) of outputs of a number N of outputs generated by said splitting step;

a second amplifying step amplifying an output generated by said splitting step other than the number (N−1) of outputs generated by said splitting step;

a number (N−1) of first filtering steps receiving outputs generated by said number (N−1) of first amplifying steps and not allowing the signal of the frequency of the modulated wave to pass therethrough and allowing a signal of a frequency band of a modulating wave of the modulated wave to pass therethrough;

a number (N−1) of inverting amplifying steps sending their outputs to said number (N−1) of first filtering steps and amplifying the signal of the frequency band of the modulating wave while inverting a phase of the signal of the frequency band of the modulating wave;

a number (N−1) of second filtering steps not allowing the signal of the frequency of the modulated wave to pass therethrough and allowing the signal of the frequency band of the modulating wave to pass therethrough and sending the signals to said number (N−1) of inverting amplifying steps and receiving the number (N−1) of outputs generated by a (N−1) splitting step splitting its input into a number (N−1) and sending the signal to an output generated by said second amplifying step; and a combining step combining at least the outputs generated by said number (N−1) of first amplifying steps to output a composite signal.

* * * * *